United States Patent
Zhu et al.

(10) Patent No.: US 12,119,065 B2
(45) Date of Patent: Oct. 15, 2024

(54) NON-VOLATILE MEMORY WITH ZONED CONTROL FOR LIMITING PROGRAMMING FOR DIFFERENT GROUPS OF NON-VOLATILE MEMORY CELLS

(71) Applicant: SANDISK TECHNOLOGIES LLC, Addison, TX (US)

(72) Inventors: Xiaochen Zhu, Milpitas, CA (US); Lito De La Rama, San Jose, CA (US); Yi Song, San Jose, CA (US); Jiacen Guo, Sunnyvale, CA (US); Jiahui Yuan, Fremont, CA (US)

(73) Assignee: SanDisk Technoloiges LLC, Austin, TX (US)

( * ) Notice: Subject to any disclaimer, the term of this patent is extended or adjusted under 35 U.S.C. 154(b) by 207 days.

(21) Appl. No.: 17/709,762

(22) Filed: Mar. 31, 2022

(65) Prior Publication Data

US 2023/0317169 A1 Oct. 5, 2023

(51) Int. Cl.
*G11C 16/10* (2006.01)
*G11C 11/56* (2006.01)
*G11C 16/04* (2006.01)
*G11C 16/14* (2006.01)
*G11C 16/34* (2006.01)
*H01L 25/065* (2023.01)
*H10B 43/27* (2023.01)

(52) U.S. Cl.
CPC .......... *G11C 16/10* (2013.01); *G11C 16/0483* (2013.01); *G11C 11/5671* (2013.01); *G11C 16/14* (2013.01); *G11C 16/3459* (2013.01); *H01L 25/0657* (2013.01); *H01L 2225/06562* (2013.01); *H10B 43/27* (2023.02)

(58) Field of Classification Search
None
See application file for complete search history.

(56) References Cited

U.S. PATENT DOCUMENTS

| | | | |
|---|---|---|---|
| 8,842,472 | B2 | 9/2014 | Kim |
| 9,652,381 | B2 | 5/2017 | Higgins et al. |
| 9,812,462 | B1 | 11/2017 | Pang et al. |
| 10,665,301 | B1 | 5/2020 | Lu et al. |

(Continued)

OTHER PUBLICATIONS

Yang, et al., "Non-Volatile Memory With Speed Control", U.S. Appl. No. 17/329,617, filed May 25, 2021.

*Primary Examiner* — J. H. Hur
(74) *Attorney, Agent, or Firm* — Vierra Magen Marcus LLP

(57) ABSTRACT

A non-volatile memory system limits the amount of programming for a first type of group of non-volatile memory cells based on a first parameter such that a maximum number of programming pulses applied to the first type of group of non-volatile memory cells to program to the last data state after the first type of group of non-volatile memory cells completed programming to the other data states is X programming pulses. The non-volatile memory system limits the amount of programming for a second type of group of the non-volatile memory cells based on a second parameter such that a maximum number of programming pulses applied to the second type of group of non-volatile memory cells to program to the last data state after the second type of group of non-volatile memory cells completed programming to the other data states is Y programming pulses.

9 Claims, 24 Drawing Sheets

(56) References Cited

U.S. PATENT DOCUMENTS

| | | | |
|---|---|---|---|
| 10,741,253 B1 | 8/2020 | Lu et al. | |
| 11,081,196 B2 | 8/2021 | Sanada | |
| 2007/0025157 A1* | 2/2007 | Wan | G11C 16/3459 |
| | | | 365/185.22 |
| 2008/0084751 A1* | 4/2008 | Li | G11C 16/3481 |
| | | | 365/185.28 |
| 2012/0008384 A1* | 1/2012 | Li | G11C 29/02 |
| | | | 365/185.33 |
| 2012/0155168 A1* | 6/2012 | Kim | G11C 5/14 |
| | | | 365/185.23 |
| 2014/0133232 A1* | 5/2014 | Avila | G11C 16/26 |
| | | | 365/185.11 |
| 2017/0069390 A1* | 3/2017 | Nam | G11C 16/14 |

* cited by examiner

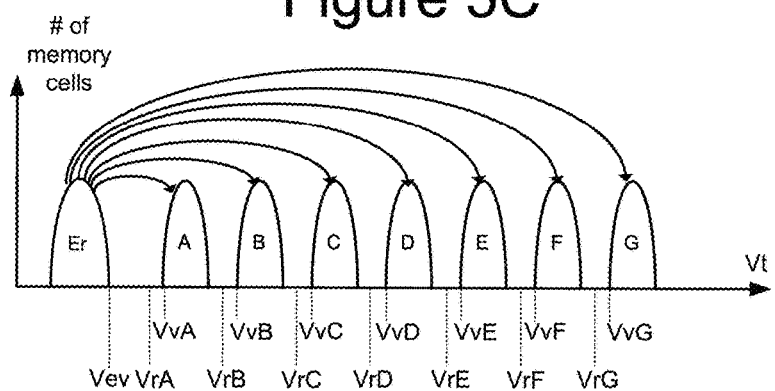
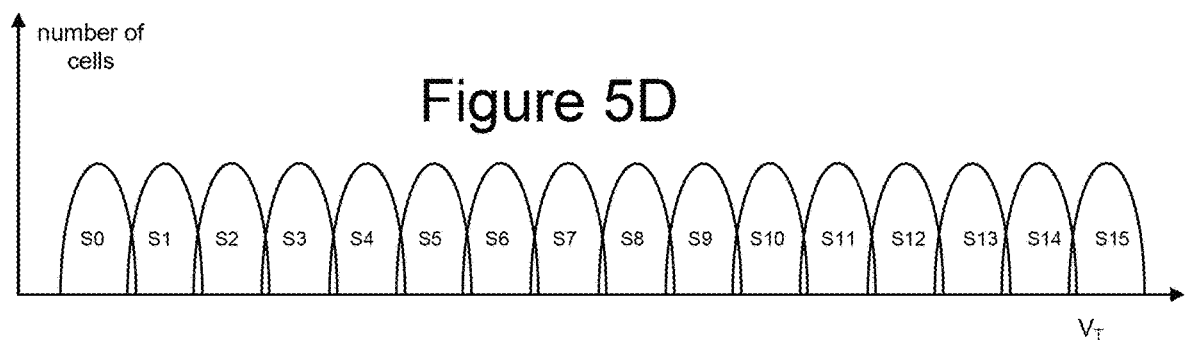

|  | 00 | 01 | 10 | 11 |
|---|---|---|---|---|
| standard sub-blocks | disable | 1 pulse | 2 pulses | 3 pulses |
| slow sub-blocks | disable | 2 pulses | 3 pulses | 3 pulses + $\Delta$ |

|  | 00 | 01 | 10 | 11 |
|---|---|---|---|---|
| standard tiers | disable | 1 pulse | 2 pulses | 3 pulses |
| slow tiers | disable | 2 pulses | 3 pulses | 3 pulses + Δ | ns.
NON-VOLATILE MEMORY WITH ZONED CONTROL FOR LIMITING PROGRAMMING FOR DIFFERENT GROUPS OF NON-VOLATILE MEMORY CELLS

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory.

Non-volatile memory is often used in connection with electronic devices. Performance of the electronic devices, including the performance of the memory is important to users. For example, users do not want to wait more than necessary for a memory system to finish programming new data.

BRIEF DESCRIPTION OF THE DRAWINGS

Like-numbered elements refer to common components in the different figures.

FIG. 5C depicts threshold voltage distributions.
FIG. 5D depicts threshold voltage distributions.

DETAILED DESCRIPTION

It has been determined that different portions of a non-volatile memory array program at different speeds and experience different magnitudes of errors. For example, differences in geometry due to fabrication may result in different behaviors. Therefore, to prevent one portion of the non-volatile memory array from slowing down programming for another portion of the non-volatile memory array, a non-volatile storage system limits the amount of programming for a first type of group of non-volatile memory cells based on a first parameter and limits the amount of programming for a second type of group of the non-volatile memory cells based on a second parameter.

For example, in one embodiment the non-volatile storage system limits the amount of programming for a first type of group of non-volatile memory cells based on a first parameter such that a maximum number of programming pulses applied to the first type of group of non-volatile memory cells to program to a last data state after the first type of group of non-volatile memory cells completed programming to the other data states is X programming pulses. The non-volatile memory system also limits the amount of programming for a second type of group of the non-volatile memory cells based on a second parameter such that a maximum number of programming pulses applied to the second type of group of non-volatile memory cells to program to the last data state after the second type of group of non-volatile memory cells completed programming to the other data states is Y programming pulses. Y can be different than X. In one embodiment, Y>X.

Figure 1:
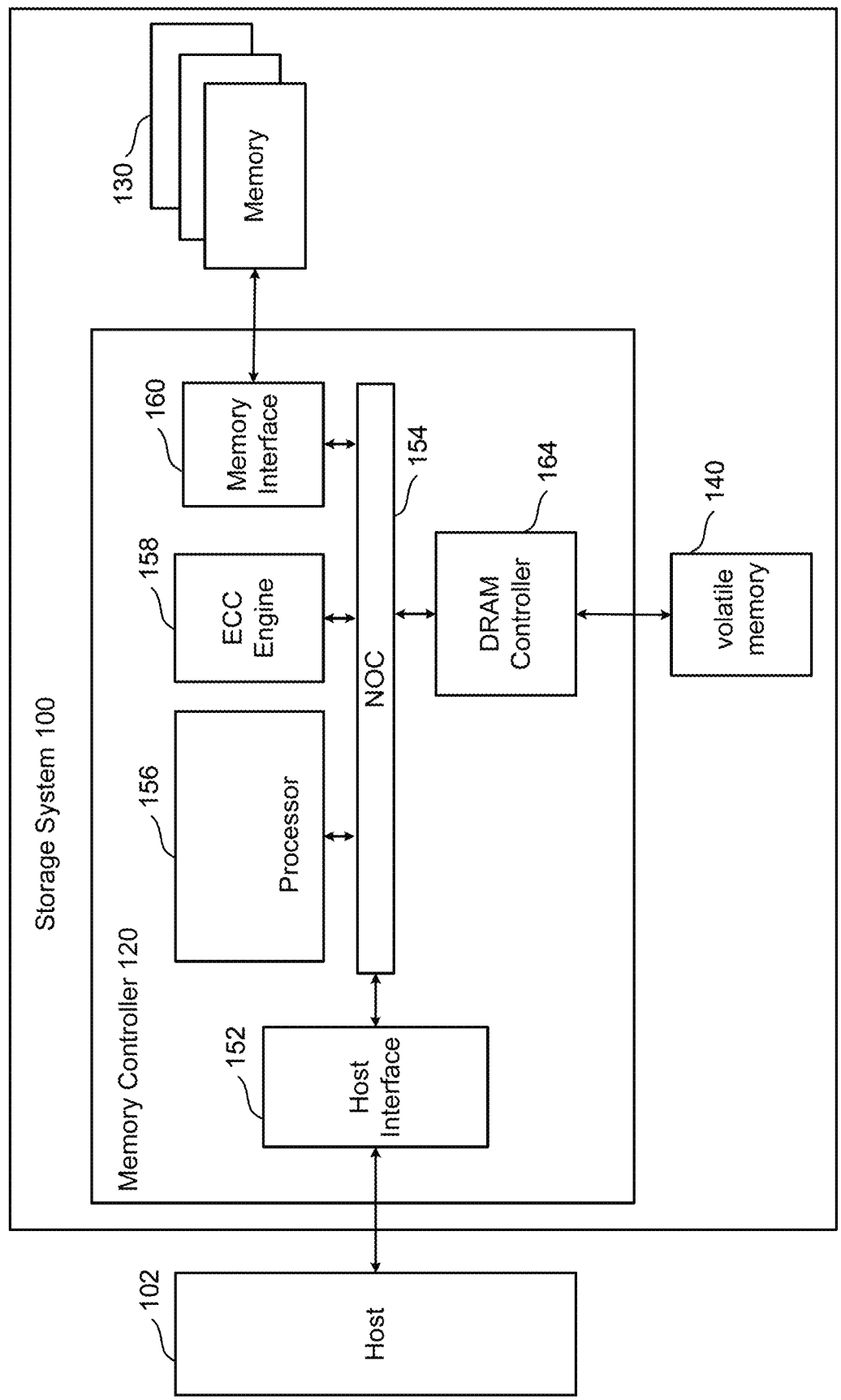
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
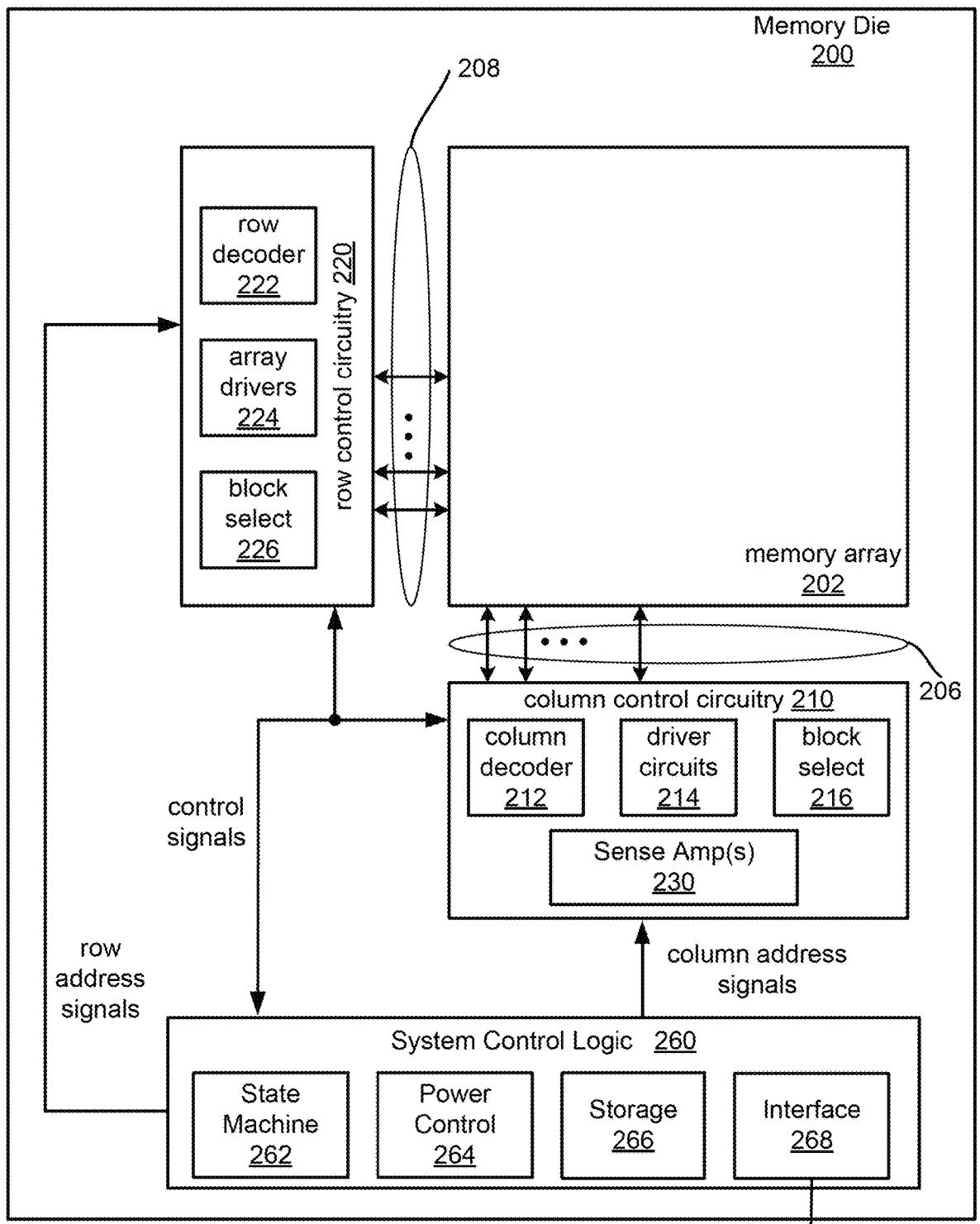
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprises non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 260, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 366 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 302 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
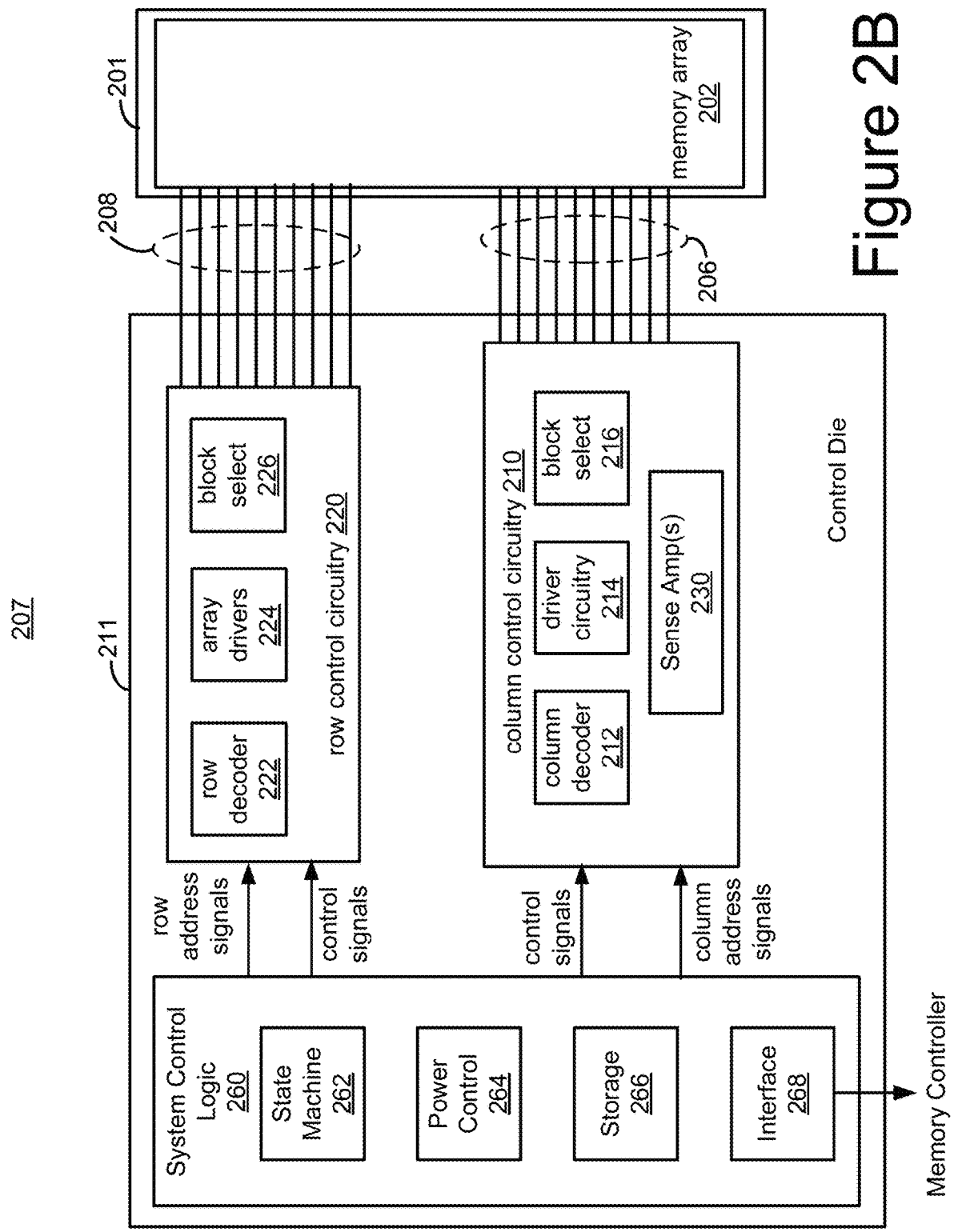
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 2C:
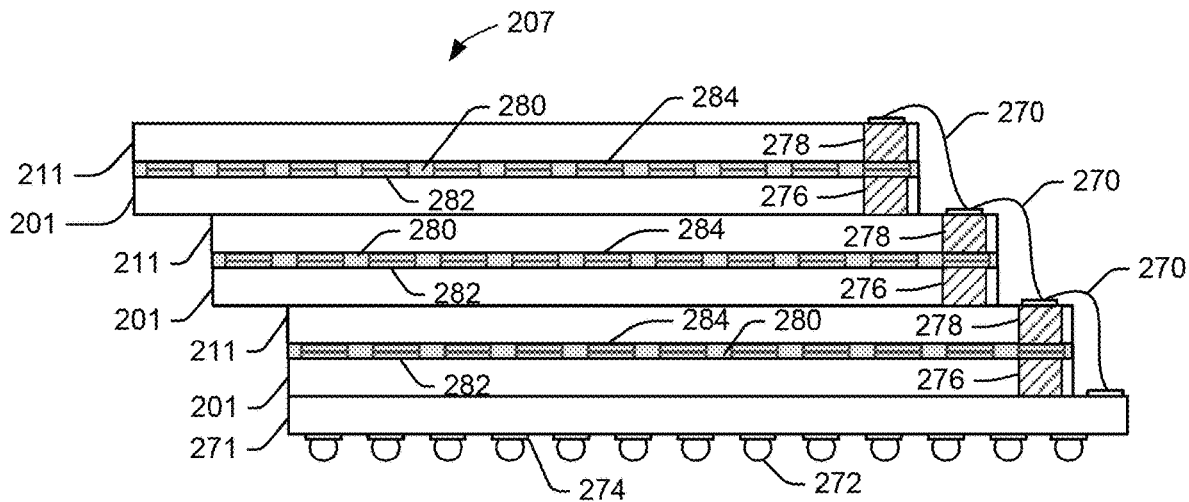
FIGS. 2C and 2D depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 2C depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 2C).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 2D:
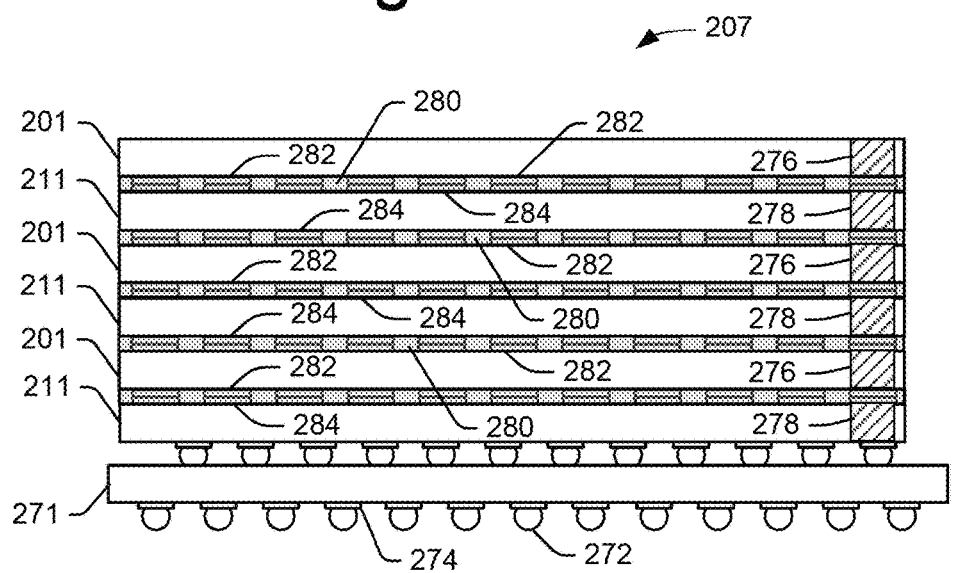

FIG. 2D depicts a side view of another embodiment of an integrated memory assembly 207 stacked on a substrate 271. The integrated memory assembly 206 of FIG. 2D has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 2C, the integrated memory assembly 207 in FIG. 2D does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller (or greater) sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 3:
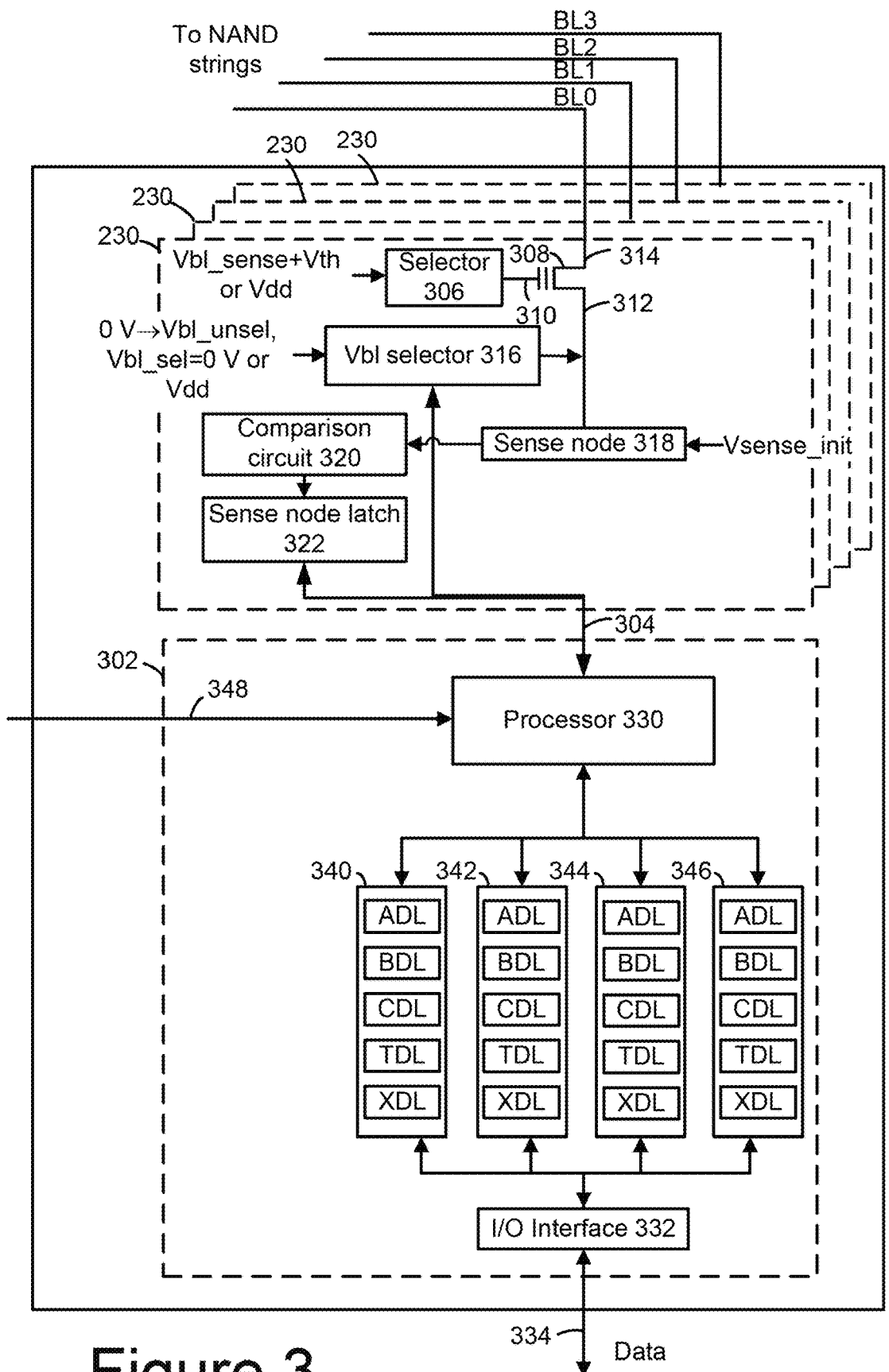
FIG. 3 depicts circuitry used to sense data from non-volatile memory.

FIG. 3 is a block diagram depicting one embodiment of a portion of column control circuitry 210 that is partitioned into a plurality of sense amplifiers 230, and a common portion, referred to as a managing circuit 302. In one embodiment, each sense amplifier 230 is connected to a respective bit line which in turn is connected to one or more NAND strings. In one example implementation, each bit line is connected to six NAND strings, with one NAND string per sub-block. Managing circuit 302 is connected to a set of multiple (e.g., four, eight, etc.) sense amplifiers 230. Each of the sense amplifiers 230 in a group communicates with the associated managing circuit via data bus 304.

Each sense amplifier 230 operates to provide voltages to bit lines (see BL0, BL1. BL2. BL3) during program, verify, erase and read operations. Sense amplifiers are also used to sense the condition (e.g., data state) to a memory cells in a NAND string connected to the bit line that connects to the respective sense amplifier.

Each sense amplifier 230 includes a selector 306 or switch connected to a transistor 308 (e.g., an nMOS). Based on voltages at the control gate 310 and drain 312 of the transistor 308, the transistor can operate as a pass gate or as a bit line clamp. When the voltage at the control gate is sufficiently higher than the voltage on the drain, the transistor operates as a pass gate to pass the voltage at the drain to the bit line (BL) at the source 314 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 306 may pass a power supply voltage Vdd, (e.g., 3-4 V) to the control gate of the transistor 308 to cause it to operate as a pass gate.

When the voltage at the control gate is lower than the voltage on the drain, the transistor 308 operates as a source-follower to set or clamp the bit line voltage at Vcg−Vth, where Vcg is the voltage on the control gate 310 and Vth, e.g., 0.7 V, is the threshold voltage of the transistor 308. This assumes the source line is at 0 V. If Vcelsrc is non-zero, the bit line voltage is clamped at Vcg−Vcelsrc−Vth. The transistor is therefore sometimes referred to as a bit line clamp (BLC) transistor, and the voltage Vcg on the control gate 310 is referred to as a bit line clamp voltage, Vblc. This mode can be used during sensing operations such as read and verify operations. The bit line voltage is thus set by the transistor 308 based on the voltage output by the selector 306. For example, the selector 306 may pass Vsense+Vth, e.g., 1.5 V, to the control gate of the transistor 308 to provide Vsense, e.g., 0.8 V, on the bit line. A Vbl selector 316 may pass a relatively high voltage such as Vdd to the drain 312, which is higher than the control gate voltage on the transistor 308, to provide the source-follower mode during sensing operations. Vbl refers to the bit line voltage.

The Vbl selector 316 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 316 can pass a program-enable voltage signal such as 0 V for respective bit lines of selected NAND strings during a program loop.

In one approach, the selector 306 of each sense circuit can be controlled separately from the selectors of other sense circuits. The Vbl selector 316 of each sense circuit can also be controlled separately from the Vbl selectors of other sense circuits.

During sensing, a sense node 318 is charged up to an initial voltage, Vsense_init, such as 3 volts. The sense node is then passed to the bit line via the transistor 308, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state.

In particular, the comparison circuit 320 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. For example, in a program-verify test, a 0 can denote fail and a 1 can denote pass. The bit in the sense node latch can be read out in a state bit scan operation of a scan operation or flipped from 0 to 1 in a fill operation. The bit in the sense node latch 322 can also be used in a lockout scan to decide whether to set a bit line voltage to an inhibit or program level in a next program loop.

Managing circuit 302 comprises a processor 330, four example sets of data latches 340, 342, 344 and 346, and an I/O interface 332 coupled between the sets of data latches and the data bus 334. FIG. 3 shows four example sets of data latches 340, 342, 344 and 346; however, in other embodiments more or less than four can be implemented. In one embodiment, there is one set of latches for each sense amplifier 230. One set of five data latches, e.g., comprising individual latches ADL, BDL, CDL, TDL and XDL, can be provided for each sense circuit. In some cases, a different number of data latches may be used. In a three bit per memory cell embodiment, ADL stores a bit for a lower page of data, BDL stores a bit for a middle page of data, CDL stores a bit for an upper page of data and XDL serves as an interface latch for storing/latching data from the memory controller. TDL can be used to store a last comparison of an even result to an odd result, as described below.

Processor 330 performs computations, such as to determine the data stored in the sensed memory cell and store the determined data in the set of data latches. Each set of data latches 340-346 is used to store data bits determined by processor 330 during a read operation, and to store data bits imported from the data bus 334 during a program operation which represent write data meant to be programmed into the memory. I/O interface 332 provides an interface between data latches 340-346 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to processor 330 via the data bus 304. At that point, processor 330 determines the resultant memory state by consideration of the tripping event(s) of the sense circuit and the information about the applied control gate voltage from the state machine via input lines 348. It then computes a binary encoding for the memory state and stores the resultant data bits into data latches 340-346.

Some implementations can include multiple processors 330. In one embodiment, each processor 330 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 330 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 340-346 from the data bus 334. During reprogramming, a respective set of data latches of a memory cell can store data indicating when to enable the memory cell for reprogramming based on the magnitude.

The program operation, under the control of the state machine 262, applies a series of programming voltage pulses to the control gates of the addressed memory cells. Each voltage pulse may be stepped up in magnitude from a previous by a step size in a processed referred to as incremental step pulse programming. Each program voltage is followed by a verify operation to determine if the memory cells has been programmed to the desired memory state. In some cases, processor 330 monitors the read back memory state relative to the desired memory state. When the two are in agreement, processor 330 sets the bit line in a program inhibit mode such as by updating its latches. This inhibits the memory cell coupled to the bit line from further programming even if additional programming pulses are applied to its control gate.

Figure 4:
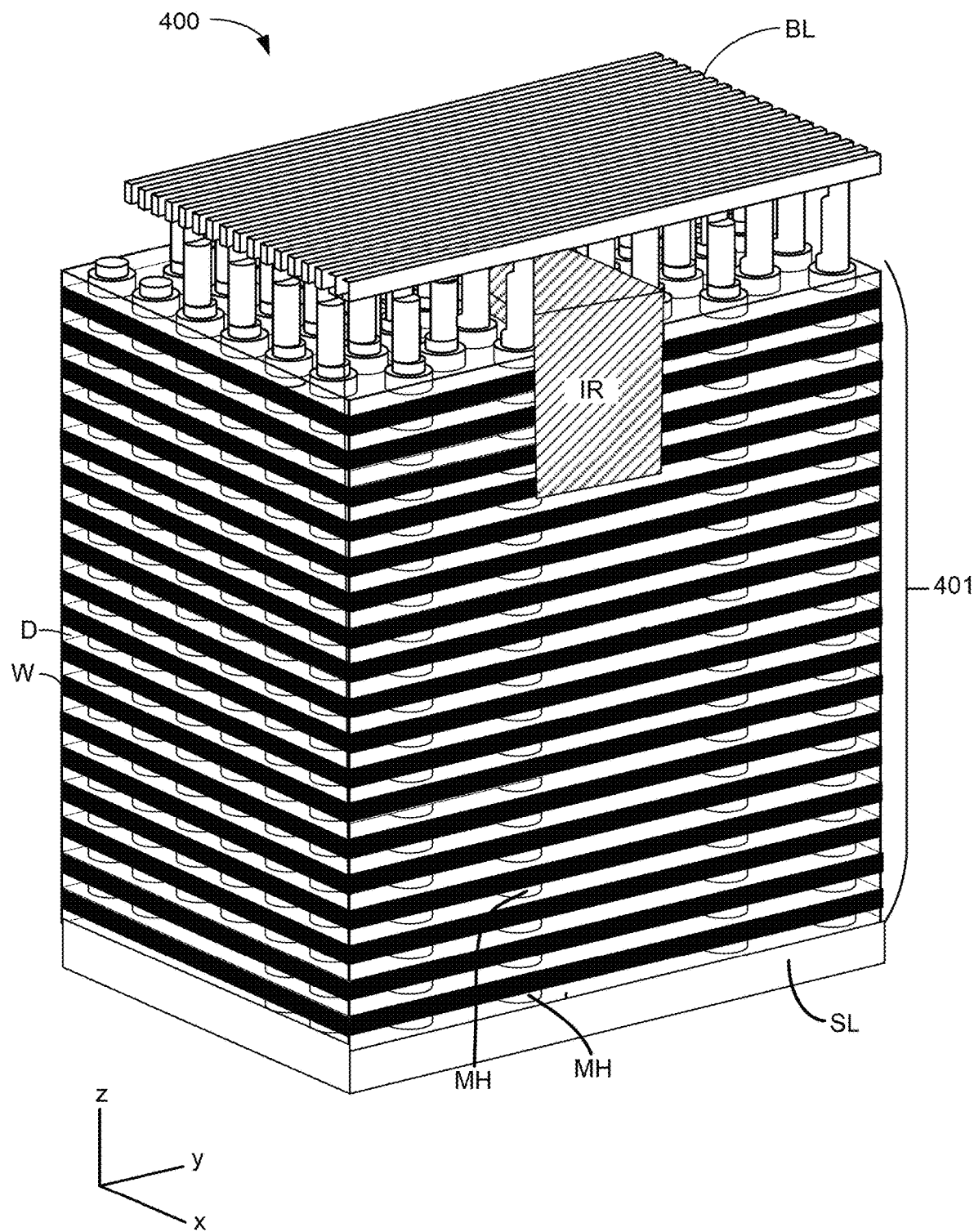
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into four or five (or a different number of) regions (also referred to as sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
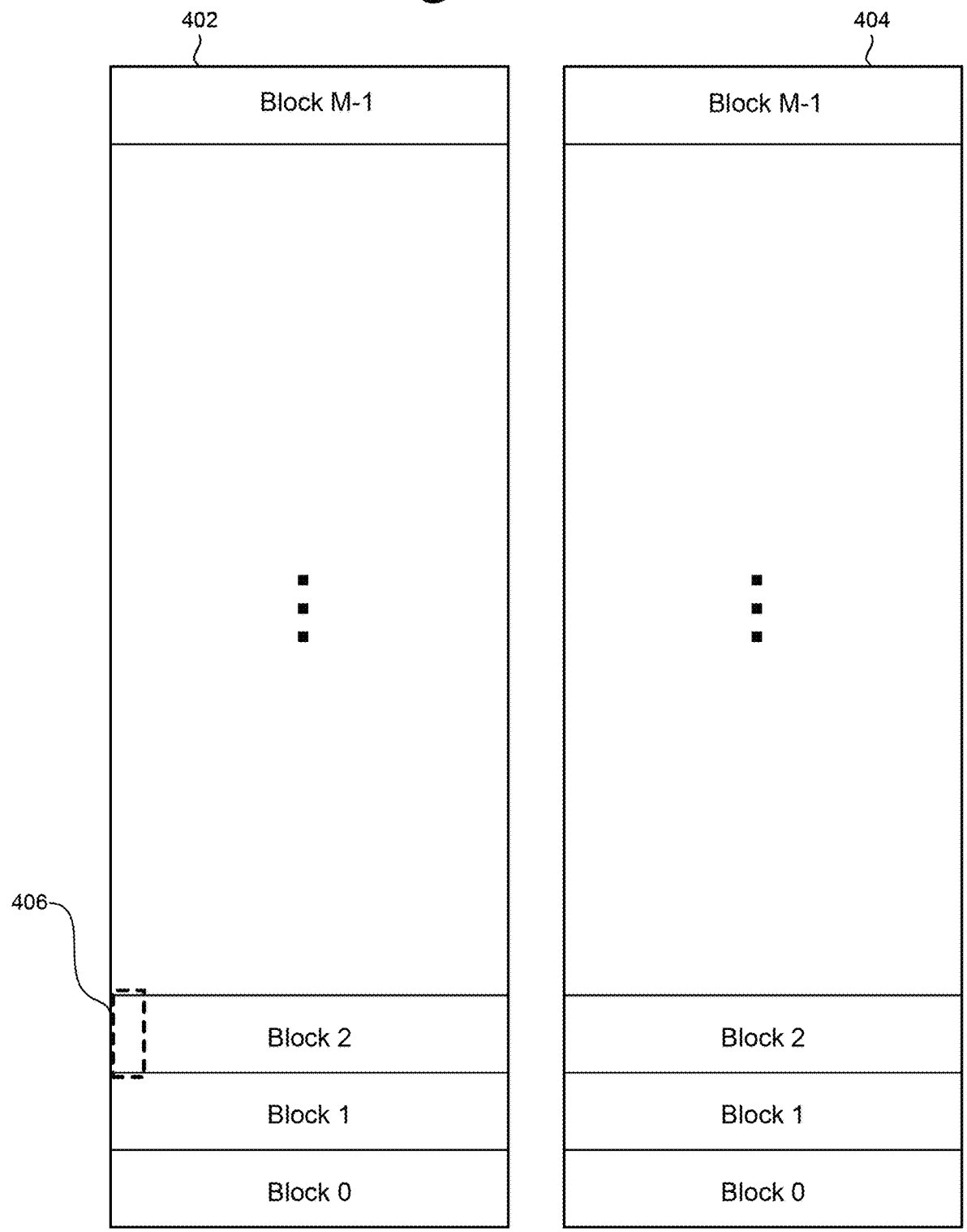
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 402/404, more or less than two planes can be implemented. In some embodiments, memory structure 202 includes eight planes.

Figure 4B:
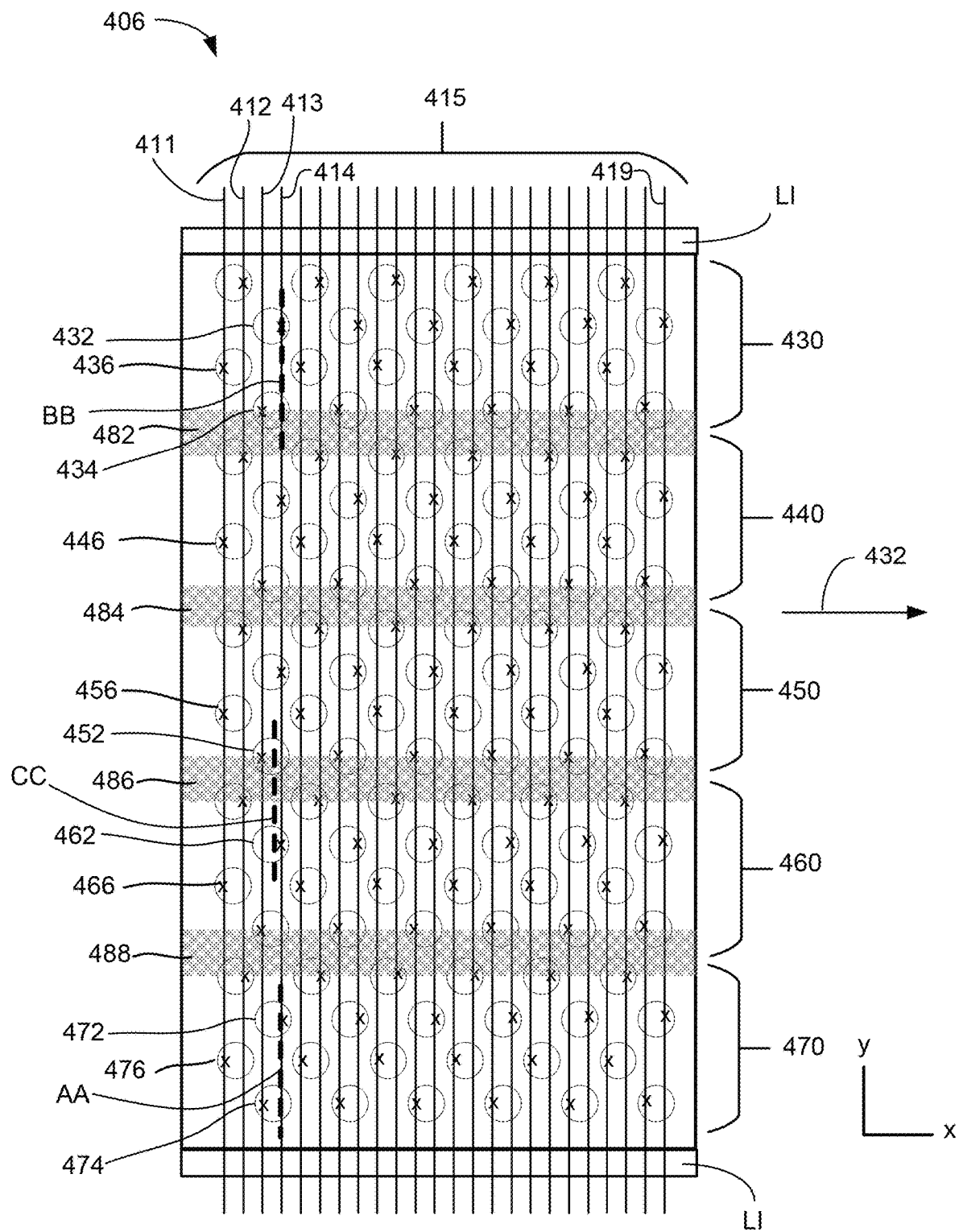
FIG. 4B depicts a top view of a portion of one embodiment of a block of memory cells.

FIGS. 4B-4G depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. In one embodiment, each vertical column implements a NAND string. For example, FIG. 4B labels a subset of the vertical columns/NAND strings 432, 436, 446. 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 436, 446, 456, 466 and 476.

The block depicted in FIG. 4B includes a set of isolation regions 482, 484, 486 and 488, which are formed of $SiO_2$; however, other dielectric materials can also be used. Isolation regions 482, 484, 486 and 488 serve to divide the top layers of the block into five regions; for example, the top layer depicted in FIG. 4B is divided into regions 430, 440, 450, 460 and 470 all of which are referred to as sub-blocks. In one embodiment, the isolation regions only divide the layers used to implement select gates so that NAND strings in different sub-blocks can be independently selected. In one example implementation, a bit line connects to one vertical column/NAND string in each of regions (sub-blocks) 430, 440, 450, 460 and 470. In that implementation, each block has twenty rows of active columns and each bit line connects to five rows in each block. In one embodiment, all of the five vertical columns/NAND strings connected to a common bit line are connected to the same set of word lines; therefore, the system uses the drain side selection lines to choose one (or another subset) of the five to be subjected to a memory operation (program, verify, read, and/or erase).

FIG. 4B also shows Line Interconnects LI, which are metal connections to the source line SL from above the memory array. Line Interconnects LI are positioned adjacent regions 430 and 470.

Although FIG. 4B shows each region 430, 440, 450, 460 and 470 having four rows of vertical columns, five regions and twenty four rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

Figure 4C:
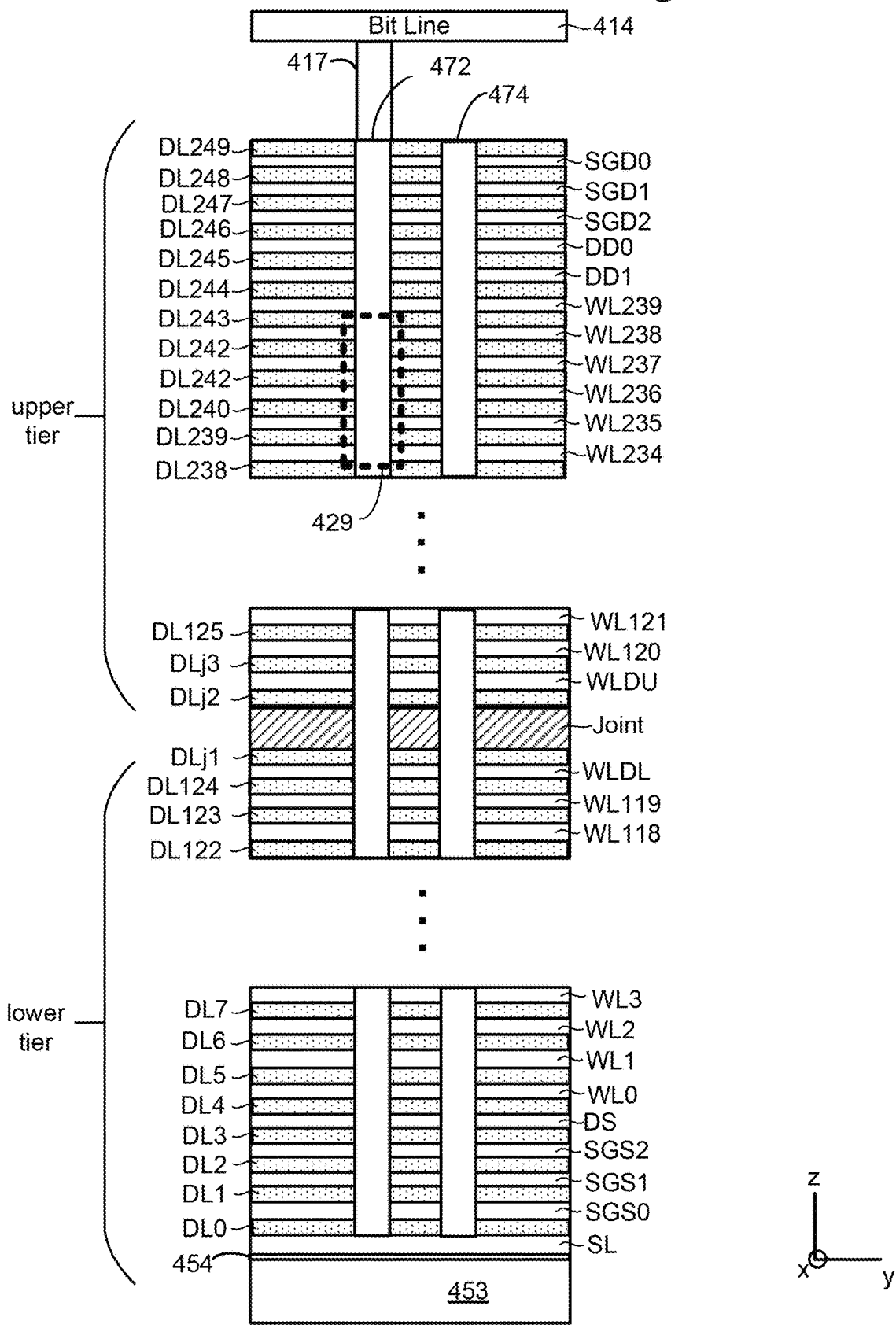
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through vertical columns (NAND strings) 472 and 474 of region 470 (see FIG. 4B). The structure of FIG. 4C includes three drain side select layers SGD0, SGD1 and SGD2; three source side select layers SGS0, SGS1, and SGS2; five dummy word line layers DD0, DD1, DDS, WLDL and WLDU; two hundred and forty word line layers WL0-WL239 for connecting to data memory cells, and two hundred and fifty three dielectric layers DL0-DL249. Other embodiments can implement more or less than the numbers described above for FIG. 4C. In one embodiment, SGD0, SGD1 and SGD2 are connected together; and SGS0, SGS1 and SGS2 are connected together. In other embodiments, more or less number of SGDs (greater or lesser than three)

are connected together, and more or less number of SGSs (greater or lesser than three) connected together.

Vertical columns 472 and 474 are depicted protruding through the drain side select layers, source side select layers, dummy word line layers and word line layers. In one embodiment, each vertical column comprises a vertical NAND string. Below the vertical columns and the layers listed below is substrate 453, an insulating film 454 on the substrate, and source line SL. The NAND string of vertical column 442 has a source end at a bottom of the stack and a drain end at a top of the stack. As in agreement with FIG. 4B, FIG. 4C show vertical column 472 connected to bit line 414 via connector 417.

For ease of reference, drain side select layers; source side select layers, dummy word line layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten, metal silicide, such as nickel silicide, tungsten silicide, aluminum silicide or the combination thereof. In some embodiments, different conductive layers can be formed from different materials. Between conductive layers are dielectric layers DL0-DL249. For example, dielectric layers DL240 is above word line layer WL235 and below word line layer WL236. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W239 connect to memory cells (also called data memory cells). Dummy word line layers DD0, DD1 and DS connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

As can be seen form FIG. 4C, the stack of alternating dielectric layers and conductive layers (e.g., word lines) of the memory array are divided into an upper tier separated from a lower tier by a Joint area. Below the Joint area is a dummy word line WLDL separated from the joint area by dielectric layer DLj1. Above the Joint area is dummy word line WLDU with dielectric layer DLj2 below WLDU and dielectric layer DLj3 above WLDU.

Figure 4D:
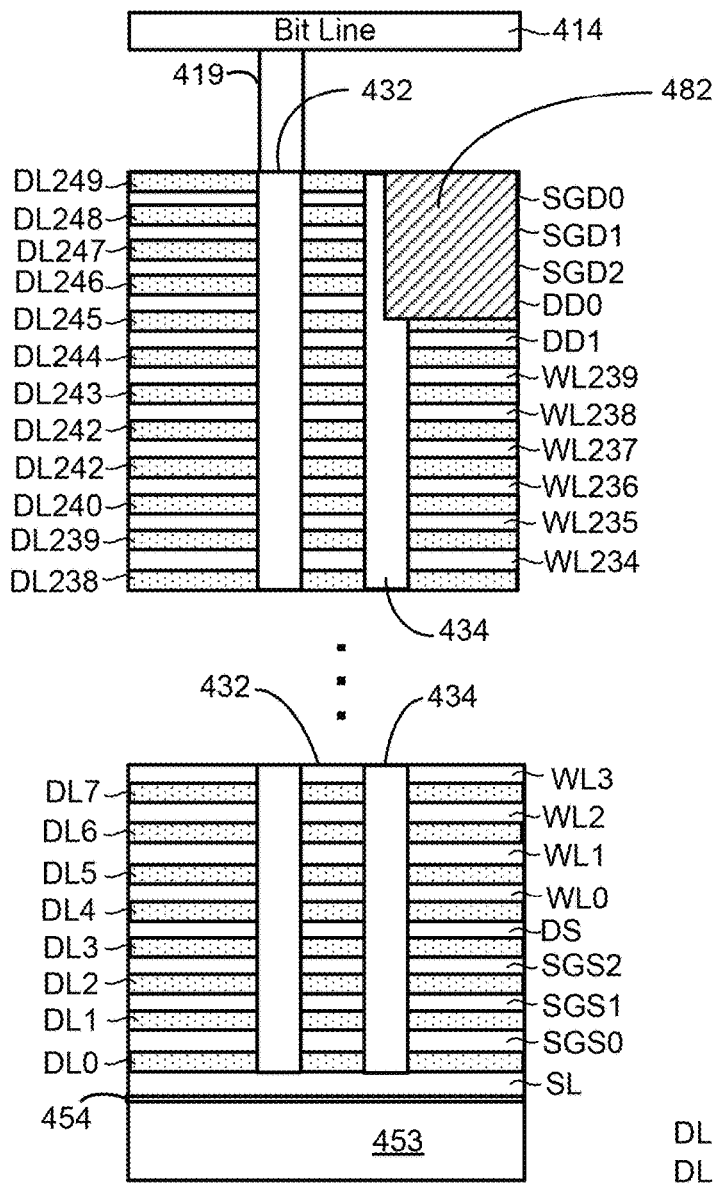
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 482, 484, 486 and 488) occupy space that would have been used for a portion of the memory holes/vertical columns/NAND stings. For example, isolation region 482 occupies space that would have been used for a portion of vertical column 434. More specifically, a portion (e.g., half the diameter) of vertical column 434 has been removed in layers SDG0, SGD1, SGD2, and DD0 to accommodate isolation region 482. Thus, while most of the vertical column 434 is cylindrical (with a circular cross section), the portion of vertical column 434 in layers SDG0, SGD1, SGD2, and DD0 has a semi-circular cross section. In one embodiment, after the stack of alternating conductive and dielectric layers is formed, the stack is etched to create space for the isolation region and that space is then filled in with $SiO_2$.

Figure 4E:
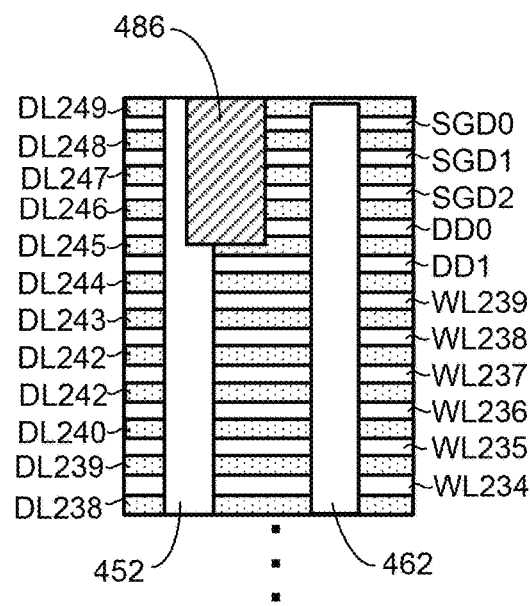
FIG. 4E depicts a cross sectional view of a portion of one embodiment of a block of memory cells.

FIG. 4E depicts a portion of one embodiment of a three dimensional memory structure 202 showing a cross-sectional view along line CC of FIG. 4B. This cross sectional view cuts through vertical columns (NAND strings) 452 and 4624 (see FIG. 4B). FIG. 4E shows the same alternating conductive and dielectric layers as FIG. 4C. FIG. 4E also shows isolation region 486 cutting into vertical columns (NAND string) 452.

Figure 4F:
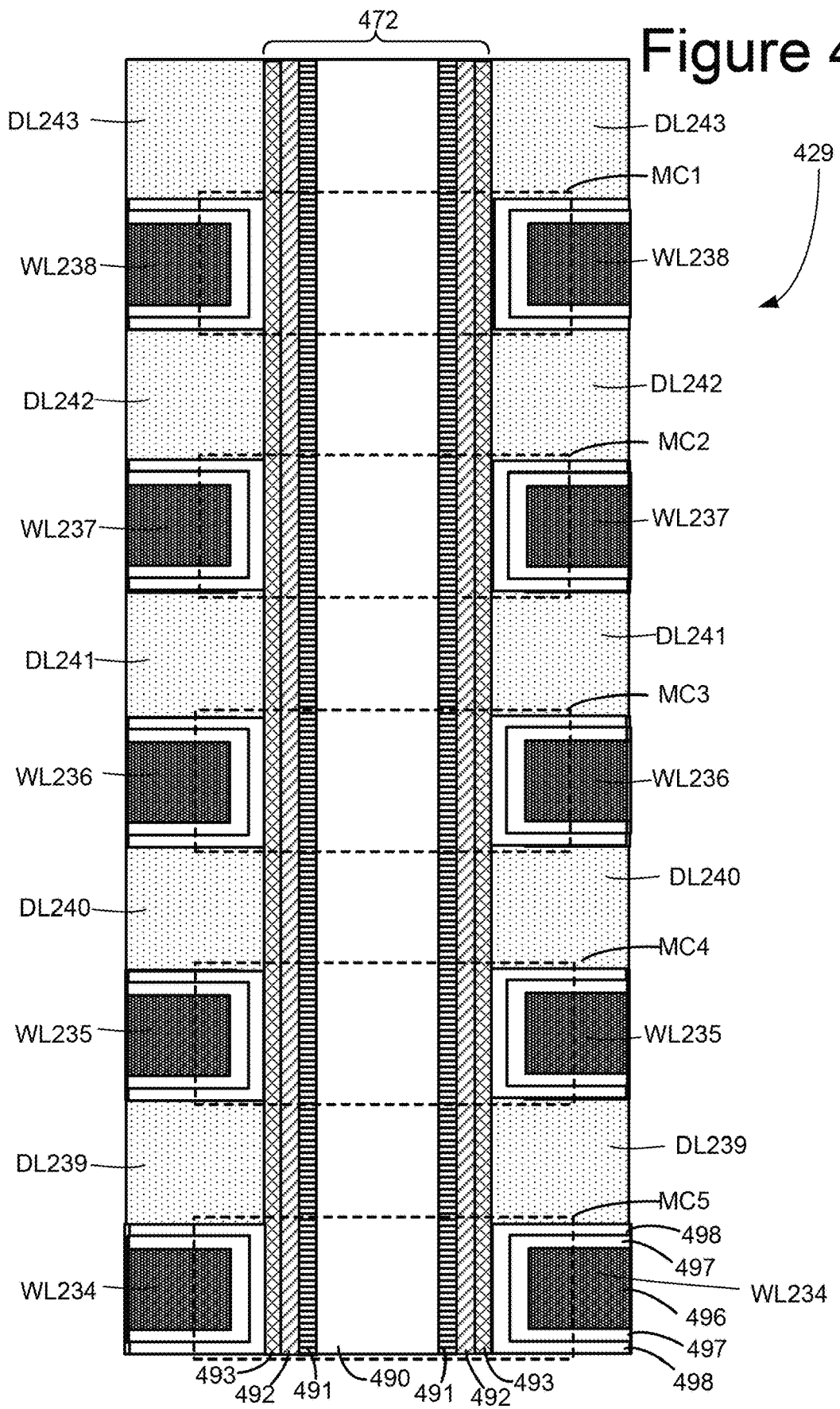
FIG. 4F is a cross sectional view of one embodiment of a vertical column of memory cells.

FIG. 4F depicts a cross sectional view of region 429 of FIG. 4C that includes a portion of vertical column 472. In one embodiment, the vertical columns are round; however, in other embodiments other shapes can be used. In one embodiment, vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4F depicts dielectric layers DL239, DL240, DL241, DL242 and DL243, as well as word line layers WL234, WL235, WL236, WL237, and WL238. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WL238 and a portion of vertical column 472 comprise a memory cell MC1. Word line layer WL237 and a portion of vertical column 472 comprise a memory cell MC2. Word line layer WL236 and a portion of vertical column 472 comprise a memory cell MC3. Word line layer WL235 and a portion of vertical column 472 comprise a memory cell MC4. Word line layer WL234 and a portion of vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4G:
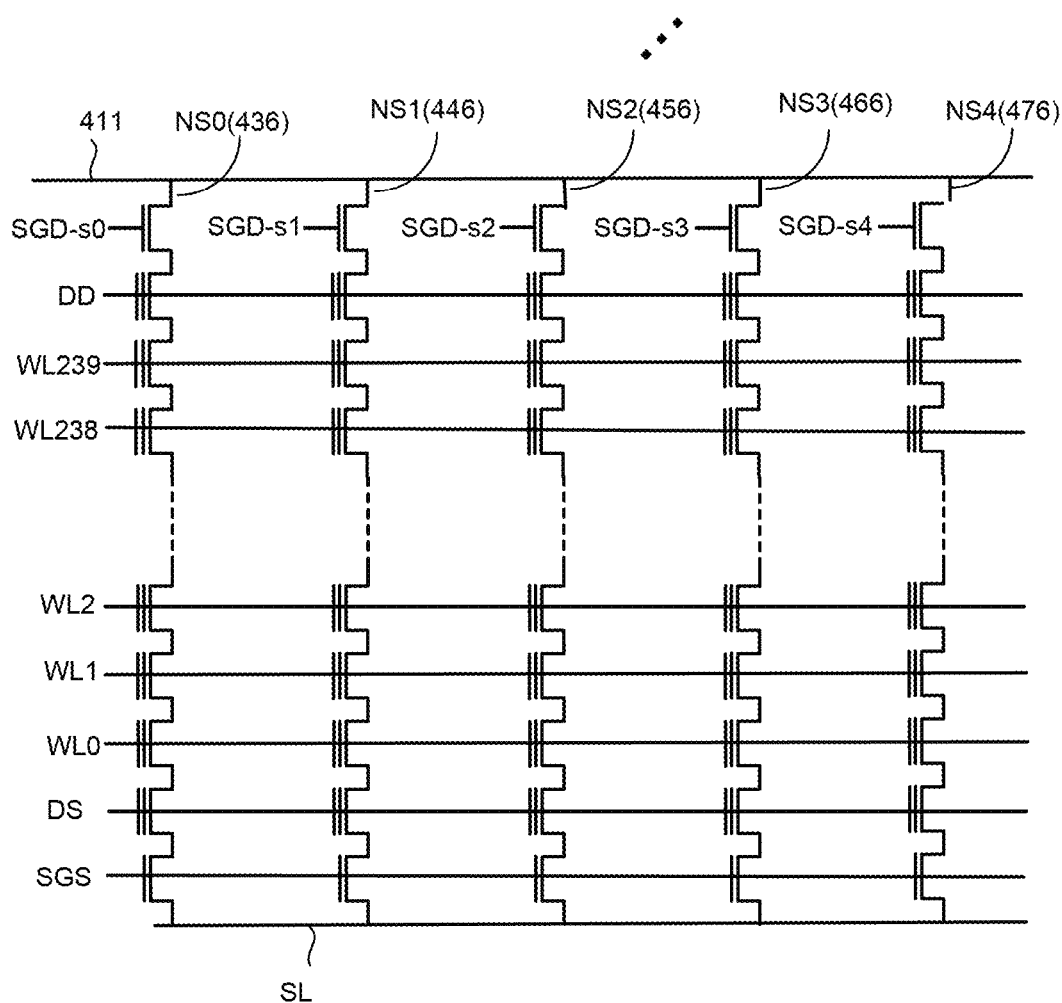
FIG. 4G is a schematic of a plurality of NAND strings in multiple sub-blocks of a same block.

FIG. 4G is a schematic diagram of a portion of the memory array 202 depicted in in FIGS. 4-4F. FIG. 4G shows physical data word lines WL0-WL239 running across the entire block. The structure of FIG. 4G corresponds to a portion 406 in Block 2 of FIG. 4A, including bit line 411. Within the block, in one embodiment, each bit line is connected to five NAND strings. Thus, FIG. 4G shows bit line connected to NAND string NS0 (which corresponds to vertical column 436), NAND string NS1 (which corresponds to vertical column 446), NAND string NS2 (which corresponds to vertical column 456), NAND string NS3 (which corresponds to vertical column 466), and NAND string NS4 (which corresponds to vertical column 476). As mentioned above, in one embodiment, SGD0, SGD1 and SGD2 are connected together to operate as a single logical select gate for each sub-block separated by isolation regions (482, 484, 486 and 486) to form SGD-s0, SGD-s1, SGD-s2, SGD-s3, and SGD-s4. SGS0, SG1 and SGS2 are also connected together to operate as a single logical select gate that is represented in FIG. 4G as SGS. Although the select gates SGD-s0, SGD-s1, SGD-s2, SGD-s3, and SGD-s4 are isolated from each other due to the isolation regions, the data word lines WL0-WL239 of each sub-block are connected together.

The isolation regions (482, 484, 486 and 486) are used to allow for separate control of sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4.

FIG. 4G only shows NAND strings connected to bit line 411. However, a full schematic of the block would show every bit line and five vertical NAND strings (that are in separate sub-blocks) connected to each bit line.

Figure 4H:
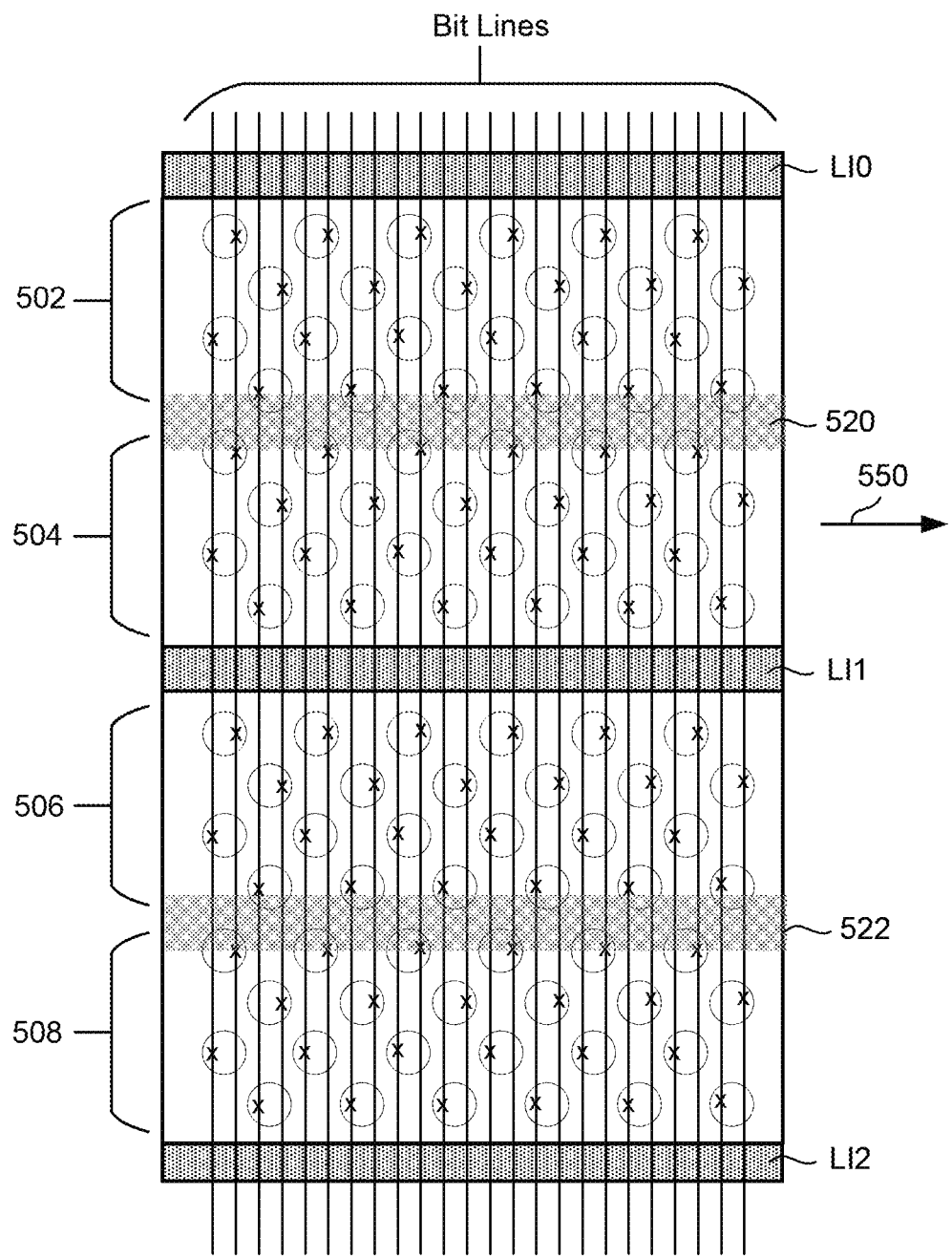
FIG. 4H depicts a top view of a portion of one embodiment of a block of memory cells.

FIG. 4H is a block diagram depicting a top view of another embodiment of a portion of a block of memory cells. As can be seen from FIG. 4H, the block depicted extends in the direction of arrow 550. In one embodiment, the memory array has many layers; however, FIG. 4H only shows the top layer. The block includes a set of Bit Lines connected to vertical columns of the block. Each of the circles representing vertical columns has an "x" to indicate its connection to one bit line. The block of memory cells depicted in FIG. 4H is divided into four sub-blocks 502, 504, 506 and 508. The block depicted in FIG. 4H includes a set of isolation regions 520 and 522, which serve to divide the top layers of block (e.g., the various SGD layers) into sub-blocks, as discussed above. In one embodiment, the isolation regions only divide the layers used to implement select gates so that NAND strings in different sub-blocks can be independently selected. For example, isolation region 520 divides sub-block 502 from sub-block 504 and isolation region 522 divides sub-block 506 from sub-block 508. Line Interconnect LI1, which separates all of the layers (except SL) of sub-block 504 from sub-block 506, is a metal connection to the source line SL from above the memory array. Line Interconnect LI0 is positioned adjacent sub-block 502 and Line Interconnect LI2 is positioned adjacent sub-block 508. In the structure of FIG. 4H, sub-blocks 502 and 504 are on one side of Line Interconnect LI1 and sub-blocks 506 and 508 are on another side of Line Interconnect LI1. Therefore, sub-blocks 502 and 504 are closely connected by the layers WL0-WL239 and sub-blocks 506 and 508 are closely connected by the layers WL0-WL239, while sub-blocks 502 and 504 are separated from sub-blocks 506 and 508 by Line Interconnect LI1. The layers of the block are otherwise the same as described above.

Figure 4I:
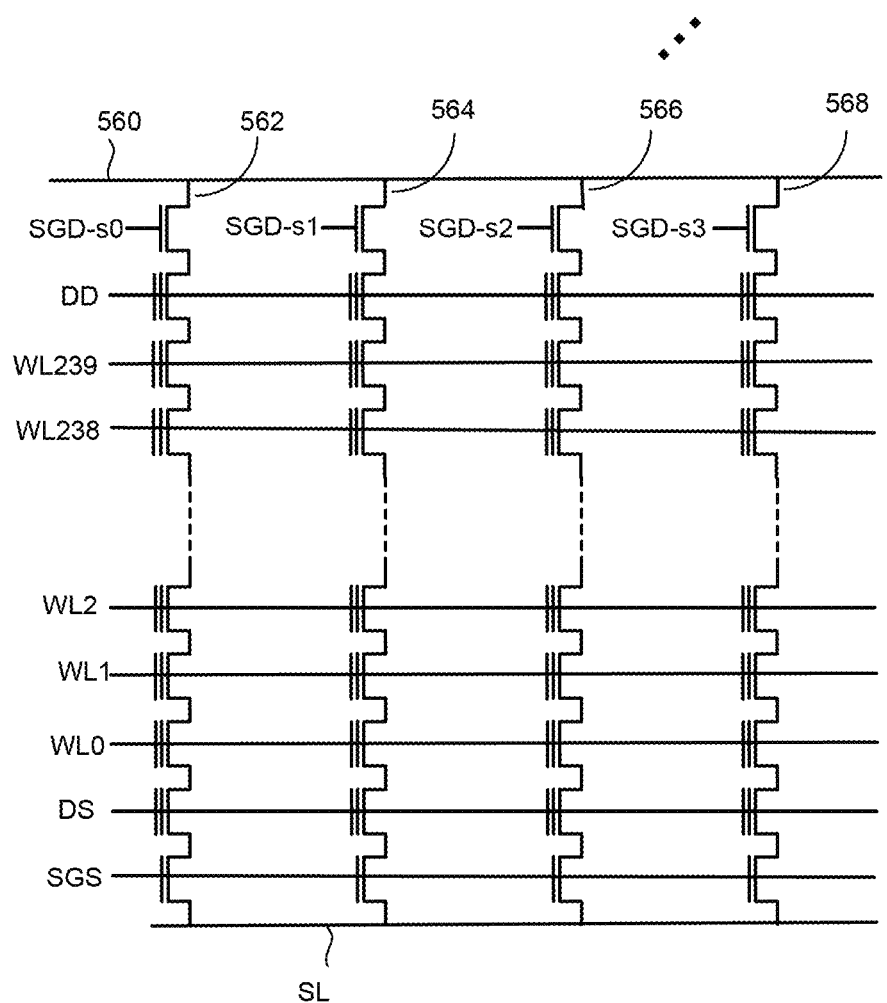
FIG. 4I is a schematic of a plurality of NAND strings in multiple sub-blocks of a same block.

FIG. 4I is a schematic diagram of a portion of the memory array depicted in in FIG. 4H. FIG. 4I shows physical data word lines WL0-WL239 running across the entire block. The structure of FIG. 4I corresponds to a portion of a block, including bit line 560. Within the block, in one embodiment, each bit line is connected to four NAND strings. Thus, FIG. 4I shows bit line 560 connected to NAND strings 562, 564, 566 and 568. As mentioned above, in one embodiment, SGD0, SGD1 and SGD2 are connected together to operate as a single logical select gate for each sub-block to form SGD-s0, SGD-s1, SGD-s2, and SGD-s3. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. FIG. 4I only shows NAND strings connected to bit line 560. However, a full schematic of the block would show every bit line and four vertical NAND strings (that are in separate sub-blocks) connected to each bit line.

Although the example memories of FIGS. 4-4I are three dimensional memory structure that includes vertical NAND strings with charge-trapping material, other (2D and 3D) memory structures can also be used with the technology described herein.

Figure 5A:
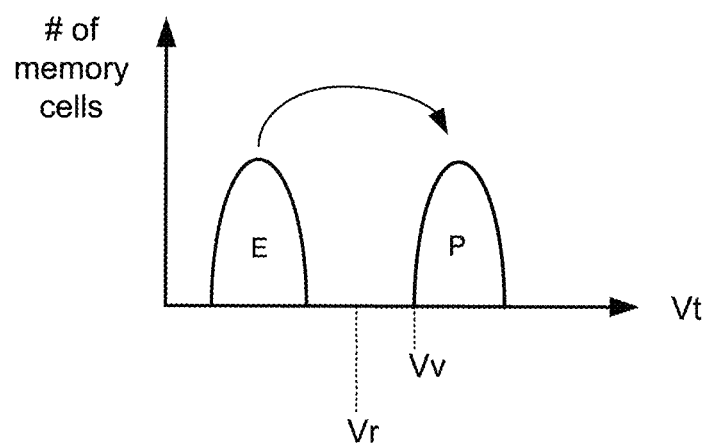
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

Figure 5B:
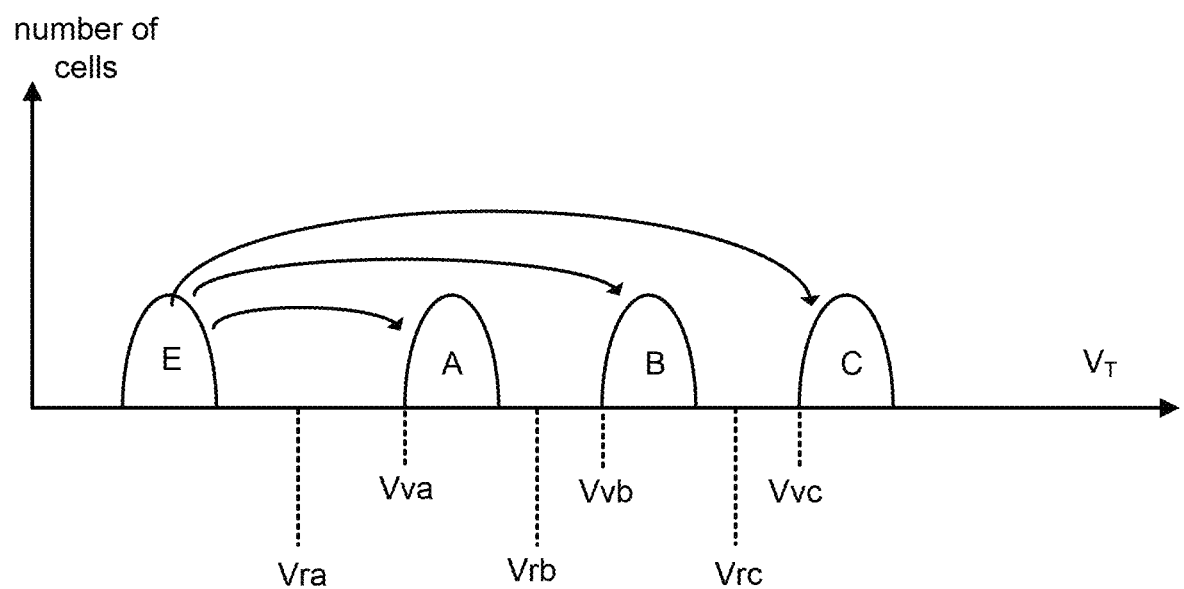
FIG. 5B depicts threshold voltage distributions.

FIGS. 5B-D illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, or five bits of data per memory cell).

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|    | E | A | B | C |
|----|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|    | Er | A | B | C | D | E | F | G |
|----|----|---|---|---|---|---|---|---|
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

FIG. 5C shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 5C also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is a voltage level to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state Er to data state A, other memory cells are being programmed from data state Er to data state B and/or from data state Er to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare levels VrA, VrB, VrC, VrD, VrE, VrF, and VrG, of FIG. 5C) or verify operation (e.g. see verify target levels VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities. Note that in some embodiments, the threshold voltage distributions for a population of memory cells storing four bits of data per memory cell do not overlap and are separated from each other. The threshold voltage distributions of FIG. 5D will include read reference voltages and verify reference voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| TP | 1  | 1  | 1  | 1  | 1  | 0  | 0  | 0  | 0  | 0  | 1   | 1   | 0   | 0   | 0   | 1   |
| UP | 1  | 1  | 0  | 0  | 0  | 0  | 0  | 0  | 1  | 1  | 1   | 1   | 1   | 1   | 0   | 0   |
| MP | 1  | 1  | 1  | 0  | 0  | 0  | 0  | 1  | 1  | 0  | 0   | 0   | 0   | 1   | 1   | 1   |
| LP | 1  | 0  | 0  | 0  | 1  | 1  | 0  | 0  | 0  | 0  | 0   | 1   | 1   | 1   | 1   | 1   |

Figure 6:
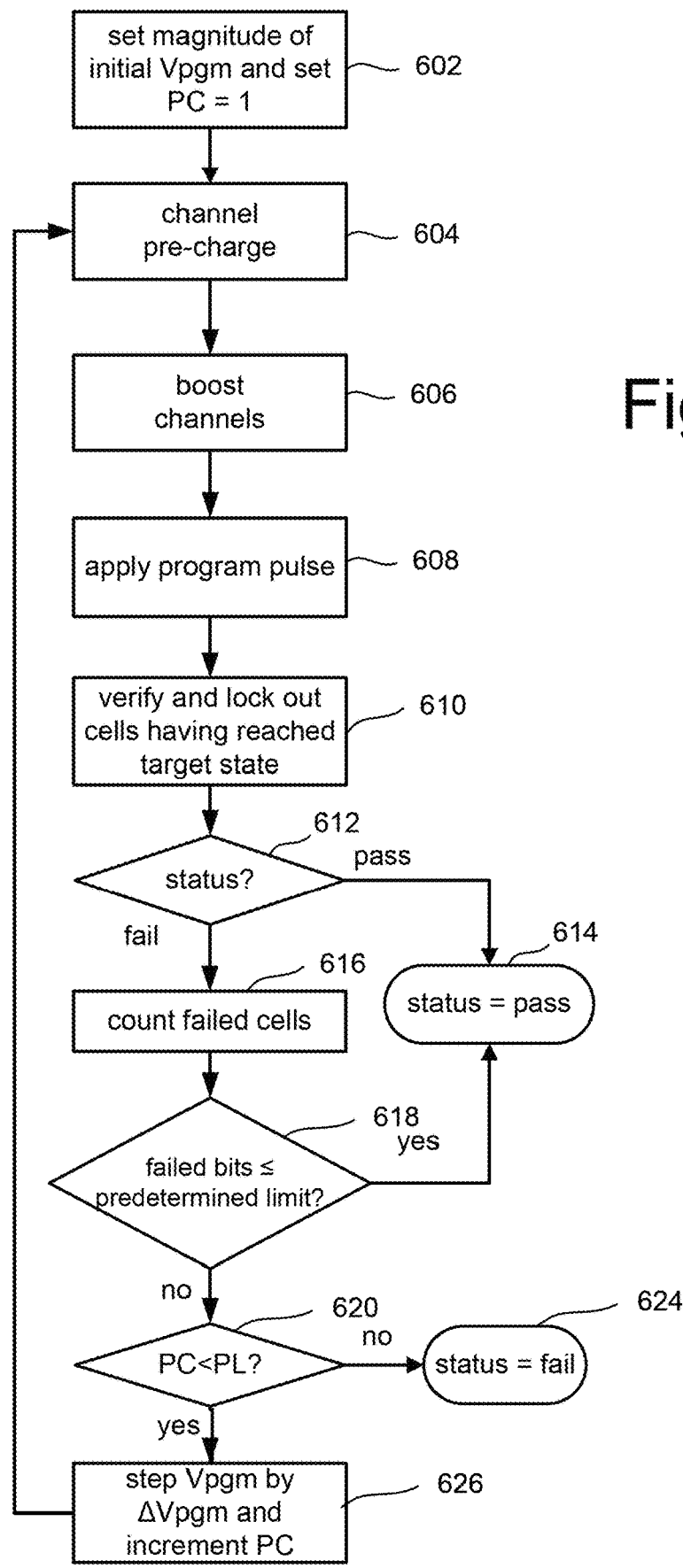
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple program loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control gates (via a selected data word line) during a program operation is applied as a series of programming pulses (e.g., voltage pulses). Between programming pulses are a set of verify pulses (e.g., voltage pulses) to perform verification. In many implementations, the magnitude of the programming pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a programming pulse (also referred to as a program voltage pulse) of the programming voltage signal Vpgm is applied to the selected word line (the word line selected for programming). If a memory cell on a NAND string should be programmed, then the corresponding bit line is biased at a program enable voltage. In step 608, the is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, then the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, then the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process continues step 604 and another programming pulse is applied to the selected word line (by the control die) so that another program loop (steps 604-626) of the programming process of FIG. 6 is performed.

In one embodiment memory cells are erased prior to programming. Erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor—SGD) that is connected to or near a bit line to generate a first GIDL current. A second GIDL voltage may be created between two terminals of a select transistor (e.g., source side select transistor—SGS) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 7:
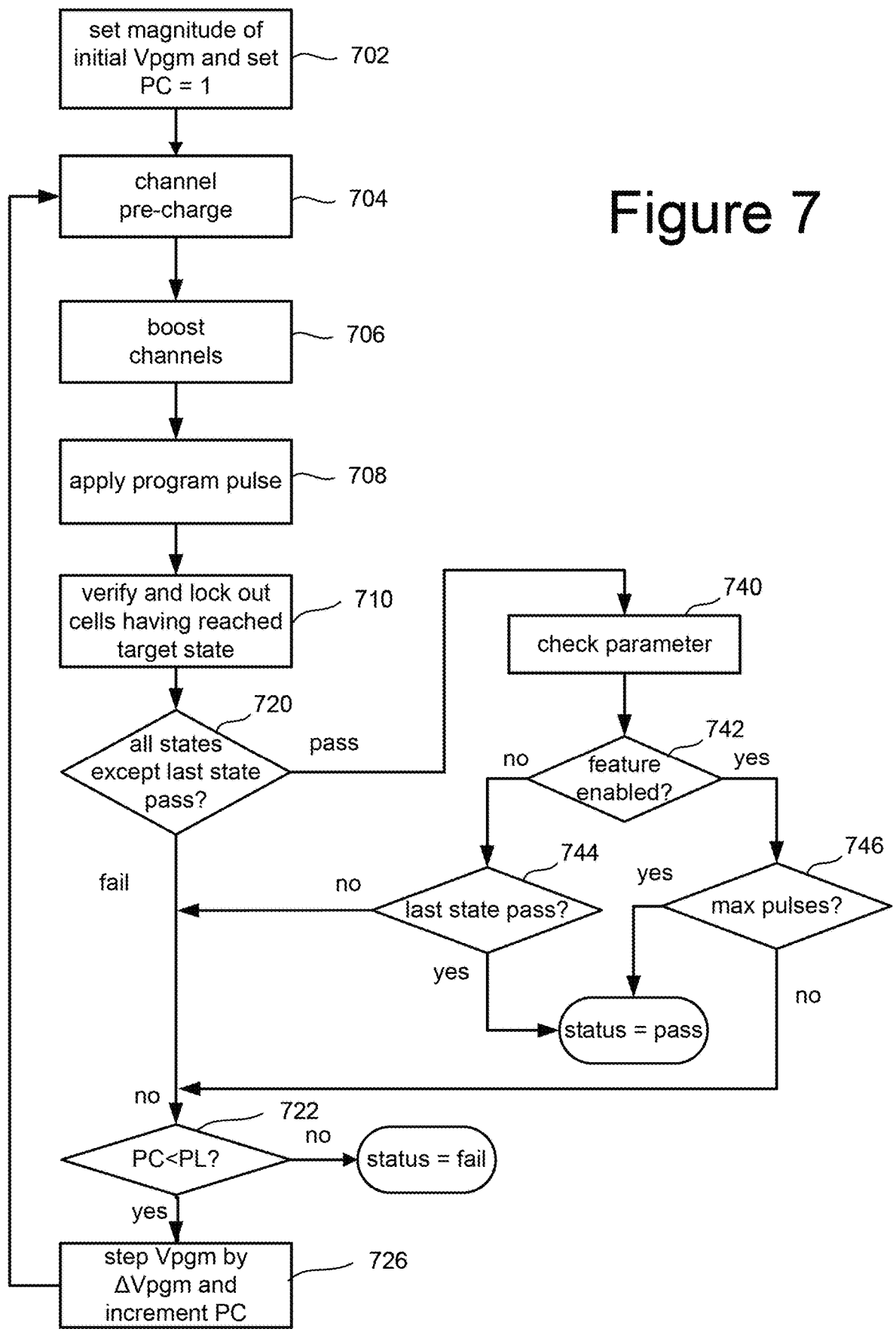
FIG. 7 is a flow chart describing one embodiment of a process for programming non-volatile memory.

FIG. 7 is a flowchart describing another embodiment of a process for programming memory cells that limits the amount of programming by limiting the number of program loops (and, thus, limiting the number of programming pulses) that can be used to program the last data state after programming to all other data states has completed. For example, in the embodiment that stores three bits of data per memory cell (see e.g., FIG. 5C), the data states include an erased data state (Er), middle data states (A-F) and a last data state (G). In general, the last data state is the data state that is designed to complete programming last, which in the example of FIG. 5C is data state G. Data state G corresponds to a threshold voltage distribution having highest threshold voltages of the plurality of threshold voltage distributions depicted in FIG. 5C. In an example embodiment that stores four bits per memory cell (see e.g., FIG. 5D) the last data state is data state S15. In an example embodiment that stores two bits per memory cell (see e.g., FIG. 5B) the last data state is data state C.

In one example embodiment, the process of FIG. 7 is performed for memory array 202 (one example of a memory structure) using the one or more control circuits (e.g., system control logic 260, column control circuitry 210, row control circuitry 220) discussed above. In one example embodiment, the process of FIG. 7 is performed by integrated memory assembly 207 using the one or more control circuits (e.g., system control logic 260, column control circuitry 210, row control circuitry 220) of control die 211 to program memory cells on memory die 201. The process includes multiple program loops, each of which includes a program phase and a verify phase.

Steps 702-710 of FIG. 7 are the same as steps 602-610 of FIG. 6. In step 720 of FIG. 7, it is determined whether programming has successfully completed for all data states except the last data state. The process of FIG. 7 programs data in a manner similar to the process of FIG. 6 until programming has successfully completed for all data states except the last data state. For example, programming will continue until memory cells targeted to data states A-F (see FIG. 5C) have successfully completed programing. After programming has successfully completed for all data states except the last data state (e.g., all memory cells targeted to data states A-F have successfully completed programing), then the one or more control circuits will continue the programming process for the last data state (e.g. data state G) but will limit the number of additional program loops (and, thus, limiting the number of programming pulses) to complete the programming of memory cells targeted to the last data state. In one embodiment, the storage system will include one or more parameters that indicate the maximum number of additional program loops (and, thus, maximum number of programming pulses) that can be utilized to complete the programming of memory cells targeted to the last data state. In one embodiment, the one or more parameters can indicate that this features is disabled (i.e. no limit on the number of additional program loops that can be utilized to complete the programming of memory cells targeted to the last data state) or the one or more parameters can indicate a maximum number (e.g., 1, 2, 3, 4 or other number) of additional program loops (and, thus, maximum number of programming pulses) that can be utilized to complete the programming of memory cells targeted to the last data state. For example, if the one or more parameters indicate a maximum number of 2, then after memory cells targeted to data states A-F have successfully completed programing, then the system will perform exactly two more program loops (apply two more programming pulses) to the population of memory cells in order to complete the programming of memory cells targeted to the last data state G (in one embodiment, regardless of the passing or failing of G state program). If the one or more parameters indicate that the feature is disabled, then after all memory cells targeted to data states A-F have successfully completed programing, then the system will perform as many program loops as needed in order to complete the programming of memory cells targeted to the last data state (However, the maximum total program loops will still be controlled by PL). Note that three bits of data per memory cell is only being used as one example, and this technology applies to more or less than three bits of data per memory cell and to different data states.

If, in step 720, it is determined that programming has not successfully completed for all data states except the last data state (e.g., all memory cells targeted to data states A-F have not successfully completed programing), then the process of FIG. 7 continues at step 722 (which is the same as step 620 of FIG. 6) and the program counter PC is checked against the program limit value (PL). If the program counter PC is not less than the program limit value PL, then the program process is considered to have failed and a status of FAIL is reported. If the program counter PC is less than the program limit value PL, then the process continues at step 726 during which time the program counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 726, the process continues step 704 and another programming pulse is applied to the selected word line so that another program loop of the programming process of FIG. 7 is performed.

If, in step 720, it is determined that programming has successfully completed for all data states except the last data state (e.g., all memory cells targeted to data states A-F have successfully completed programing), then the process of FIG. 7 continues at step 740 and the above-described parameter is checked to see if the parameter indicates that the feature is disabled or the parameter indicates a maximum number (e.g., 1, 2, 3, 4 or other number) of additional program loops (and, thus, maximum number of programming pulses) that can be utilized to complete the programming of memory cells targeted to the last data state. If the feature is not enabled (step 742) then it is determined (step 744) whether has programming has successfully completed for the last data state. If programming has not successfully completed for the last data state, then the process continues at step 722. If programming has successfully completed step 744) for the last data state, then the program process is considered to have succeeded and a status of PASS is reported. If the feature is enabled (step 742) then it is determined whether the maximum number (as indicted by the parameter) of additional program loops (and, thus, maximum number of programming pulses) that can be utilized to complete the programming for memory cells targeted to the last data state have been already performed (step 746). If the maximum number of additional program loops (and, thus, maximum number of programming pulses) that can be utilized to complete the programming for memory cells targeted to the last data state have been already performed, then the program process is considered to have succeeded and a status of PASS is reported. If the maximum number of additional program loops (and, thus, maximum number of programming pulses) that can be utilized to complete the programming for memory cells targeted to the last data state have not been already performed, then the process continues at step 722.

Figure 8A:
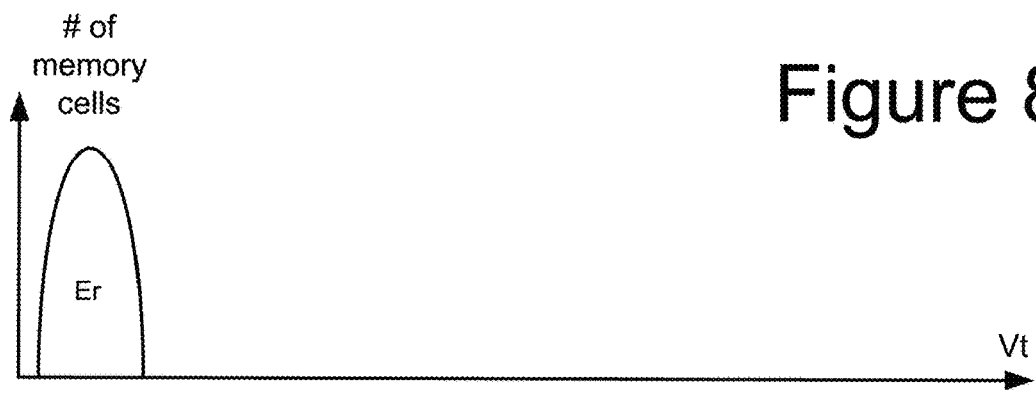
FIGS. 8A-8C depict threshold voltage distributions.
Figure 8B:
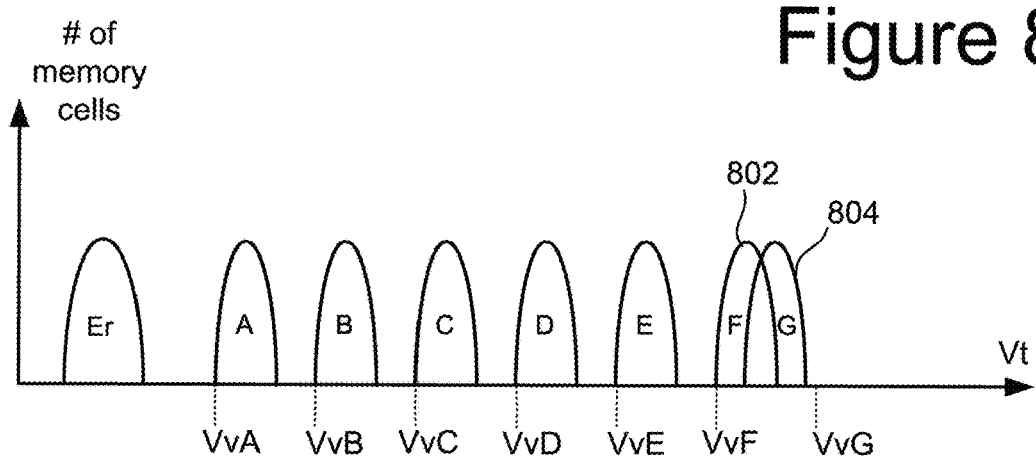
Figure 8C:
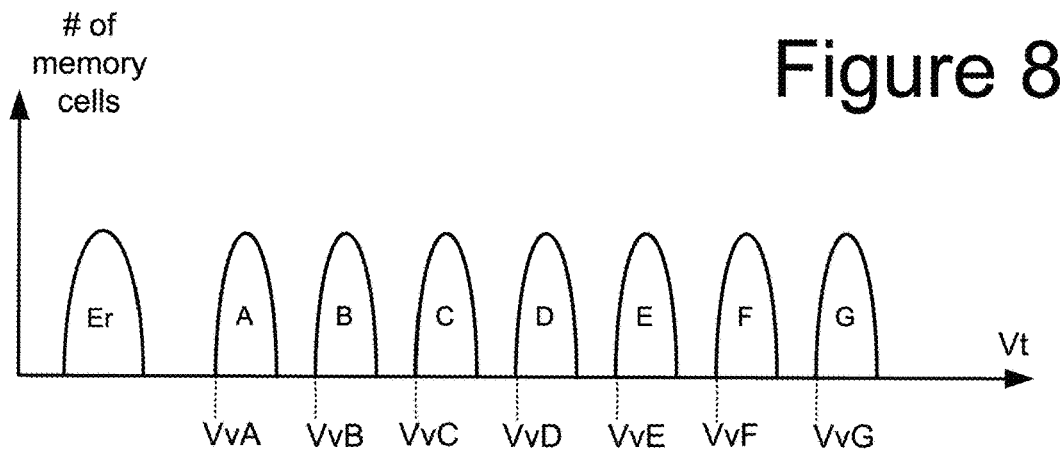

FIGS. 8A-C depict threshold voltage distributions and describe an example implementation of the process of FIG. 7. FIG. 8A shows all of the memory cells (of a population of memory cells being programmed) in the erased state Er prior to performing the process of FIG. 7. FIG. 8B depicts the population of memory cells being programmed at the first time that, in step 720, it is determined that programming has successfully completed for all data states except the last data state (e.g., all memory cells targeted to data states A-F have successfully completed programing). As can be seen from FIG. 8B, all memory cells targeted to data states A-F have successfully completed programing and are in their corresponding threshold voltage distributions; however, the memory cells targeted to be programmed to data state G are not at the appropriate threshold voltage level yet (e.g., the memory cells targeted to data state G have threshold voltages less than VvG). At the point in time depicted in FIG. 8B, the programming process will only apply M additional programming pulses (during M additional program loops) to the population of memory cells, where M is defined by the above-described parameter. FIG. 8C depicts the population of memory cells after the M additional programming pulses have been applied to the population of memory cells.

Some memory systems perform the process of FIG. 7 with the same parameter value (see step 740) for all memory cells of memory array 202. However, it has been determined that different portions of a non-volatile memory array program at different speeds and experience different magnitudes of errors. For example, differences in geometry of different portions of the memory array that results from variations during the fabrication process may cause differences in program speeds. Therefore, in some prior systems, the parameter may be chosen based on performance of the block with the slowest programming memory cells. But that causes all programming to be slower than necessary. Therefore, to prevent one portion of the non-volatile memory array from slowing down programming for another portion of the non-volatile memory array, it is proposed to utilize multiple (e.g., two) parameters. For example, one parameter will be used for fast (or standard) programming memory cells and a second parameter will be used for slow programming memory cells. In other embodiments, the memory cells can be divided into more than two groups and utilize more than two parameters; for example, three groups (slow, medium and fast) can be used with three parameters, four groups (slow, medium slow, medium fast, fast) can be used with four parameters, etc. Thus, the process of FIG. 7 can be changed so that step 740 will include checking the appropriate parameter(s) for the memory cells being programmed. In one embodiment, the unit of programming is one page of data; therefore, all memory cells being programmed for a page of data may have the same parameter for the process of FIG. 7. In other embodiments, each block or sub-block (or other grouping of memory cells) can share a parameter.

Figures 9, 10:
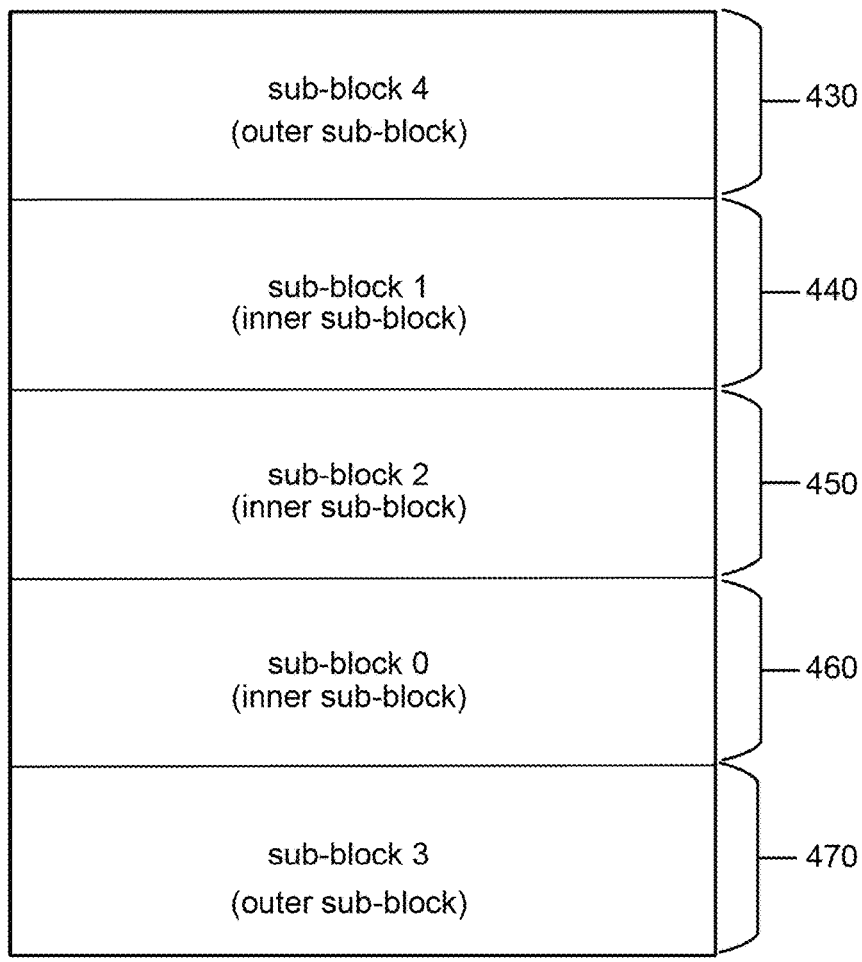
FIG. 9 is a block diagram that depicts a block divided into sub-blocks.
FIG. 10 is a table describing two parameters used to configure the programming process.

In one embodiment, all of the memory cells of the entire storage system (or all of the memory cells of a same die or same set of die) can be categorized into two groups so that only two parameters need to be stored/maintained. As discussed above, in some embodiments the blocks are divided into sub-blocks. For example, the block of memory cells depicted in FIG. 4B is divided into sub-blocks 430, 440, 450, 460 and 470. FIG. 9 is a block diagram that also shows the same block with sub-blocks 430, 440, 450, 460 and 470. In FIG. 9, the sub-blocks are labeled with logical block numbers according to order of programming: sub-block 0 (460), sub-block 1 (440), sub-block 2 (450), sub-block 3 (470) and sub-block 4 (430). Sub-block 3 and sub-block 4 are at the ends of the block and are referred to as outer sub-blocks. Sub-block 0, sub-block 1, and sub-block 2 are between sub-block 3 and sub-block 4 and are referred to as inner-sub-blocks. It has been determined that the outer sub-blocks (sub-block 3 and sub-block 4) program slower and with more errors than the inner sub-blocks (sub-block 0, sub-block 1, and sub-block 2). Therefore, one embodiment includes two parameters: a first parameter for inner sub-blocks (e.g., sub-block 0, sub-block 1, and sub-block 2) and a second parameter for outer sub-blocks (e.g., sub-block 3 and sub-block 4). The inner sub-blocks can be referred to as standard (or fast) sub-blocks and the outer sub-blocks can be referred to as slow sub-blocks. For example when programming any block of the storage system 100, if the programming is for a standard sub-block then the first parameter is used and if the programming is for a slow sub-block then the second parameter is used. Another embodiment includes two parameters: a first parameter for standard sub-blocks and a second parameter for slow sub-blocks, where the definitions of standard sub-block and slow sub-block are other than inner/outer sub-blocks.

FIG. 10 is a table depicting example values of the first parameter for standard sub-blocks (e.g., sub-block 0, sub-block 1, and sub-block 2) and a second parameter for slow sub-blocks (e.g., sub-block 3 and sub-block 4). If either parameter is set to 00, then the feature of limiting the number of program loops of the programming process (and programming pulses) applied after all memory cells targeted to data states A-F have successfully completed programing is disabled. If the first parameter for standard sub-blocks (e.g., sub-block 0, sub-block 1, and sub-block 2) is set to 01, then after all memory cells targeted to data states A-F have successfully completed programing only one additional programming pulse is applied to program memory cells targeted to data state G. If the first parameter for standard sub-blocks (e.g., sub-block 0, sub-block 1, and sub-block 2) is set to 10, then after all memory cells targeted to data states A-F have successfully completed programing only two additional programming pulses are applied to program memory cells targeted to data state G. If the first parameter for standard sub-blocks (e.g., sub-block 0, sub-block 1, and sub-block 2) is set to 11, then after all memory cells targeted to data states A-F have successfully completed programing only three additional programming pulses are applied to program memory cells targeted to data state G. If the second parameter for slow sub-blocks (e.g., sub-block 3 and sub-block 4) is set to 01, then after all memory cells targeted to data states A-F have successfully completed programing only two additional programming pulses are applied to program memory cells targeted to data state G. If the second parameter for slow sub-blocks (e.g., sub-block 3 and sub-block 4) is set to 10, then after all memory cells targeted to data states A-F have successfully completed programing only three additional programming pulses are applied to program memory cells targeted to data state G. If the second parameter for slow sub-blocks (e.g., sub-block 3 and sub-block 4) is set to 11, then after all memory cells targeted to data states A-F have successfully completed programing only 3+Δ additional programming pulses are applied to program memory cells targeted to data state G. In one embodiment, Δ=2. Other values for A can be used. In one embodiment, Δ is determined dynamically (at time of performance of the programming) by the one or more control circuits based on system performance (e.g., # of programming loops needed for all memory cells targeted to data states A-F to successfully complete programming). In some embodiments, when feature enabled, the last program pulse will skip verify which saves program time. For example, when the parameter=11 (additional loops=3), the first two program loops will incorporate G state verify while the third program loop will only include program pulse without the verify process, FIGS. 9 and 10 describe an embodiment where outer sub-blocks are designated slow sub-blocks and inner sub-blocks are designated standard sub-blocks. In other embodiments, other criteria can be used to determine standard/slow sub-blocks. In some embodiments, the one or more control circuits can test to see which sub-blocks (or other groupings) are standard/slow. Other criteria can be used to determine standard/slow, such as shape of memory holes, thickness of various layers, programming speed data, existence of tails in threshold voltage distributions, statistical tier dependent MANOS profile analysis, etc. In one set of embodiments, the determination of fast/slow, and the value of the parameters, is made at the time of testing (at fabrication) and/or trimming.

Figures 11, 12:
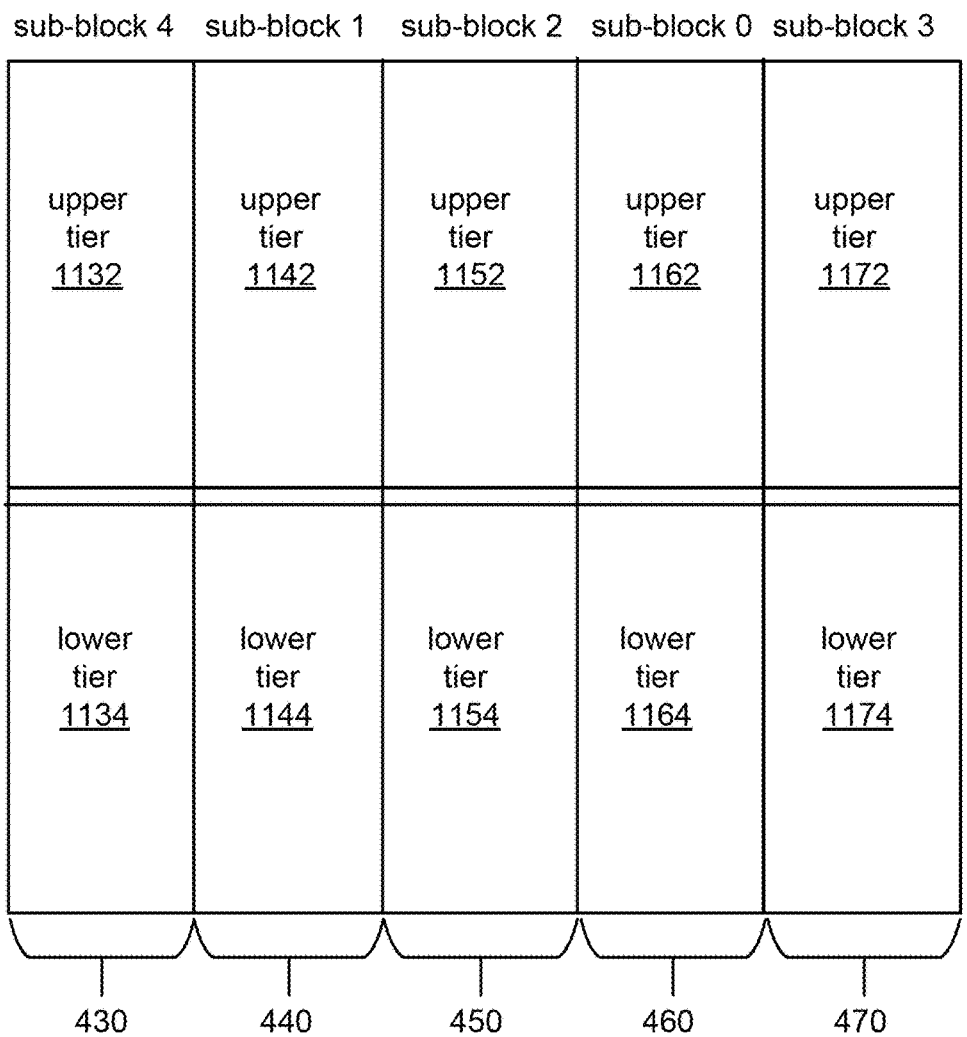
FIG. 11 is a block diagram that depicts a block divided into tiers.
FIG. 12 is a table describing two parameters used to configure the programming process.

FIGS. 11 and 12 describe an embodiment where the standard/slow designation is determined for tiers, rather than sub-blocks. Looking back at FIG. 4C, it can be seen the stack of alternating dielectric layers and conductive layers (e.g., word lines) of the memory array are divided into an upper tier separated from a lower tier by a Joint area. FIG. 11 is a side view of the block showing each sub-block divided into an upper tier and lower tier. For example, sub-block 4 (430) includes upper tier 1132 and lower tier 1134; sub-block 1 (440) includes upper tier 1142 and lower tier 1144; sub-block 2 (450) includes upper tier 1152 and lower tier 1154; sub-block 0 (460) includes upper tier 1162 and lower tier 1164; and sub-block 3 (470) includes upper tier 1172 and lower tier 1174.

It has been determined that the upper tiers of the outer sub-blocks program slower than the other tiers of the same block. For example, upper tier 1132 and upper tier 1172 program slower than the tiers 1134, 1142, 1144, 1152, 1154, 1162, 1164 and 1174 of the same block. Therefore, one embodiment includes two parameters: a first parameter for standard tiers (e.g., tiers 1134, 1142, 1144, 1152, 1154, 1162, 1164 and 1174) and a second parameter for slow tiers (e.g., 1132 and 1172). For example when programming any block of the storage system 100, if the programming is for a standard tier then the first parameter is used and if the programming is for a slow tier then the second parameter is used. FIG. 12 is a table depicting example values of the first parameter for standard tiers (e.g., 1134, 1142, 1144, 1152, 1154, 1162, 1164 and 1174) and a second parameter for slow tiers (e.g., 1132 and 1172). In other embodiments, other criteria can be used to determine standard/slow tiers. In some embodiments, the one or more control circuits can test to determine what tiers (or other groupings) are standard/slow.

Figure 13:
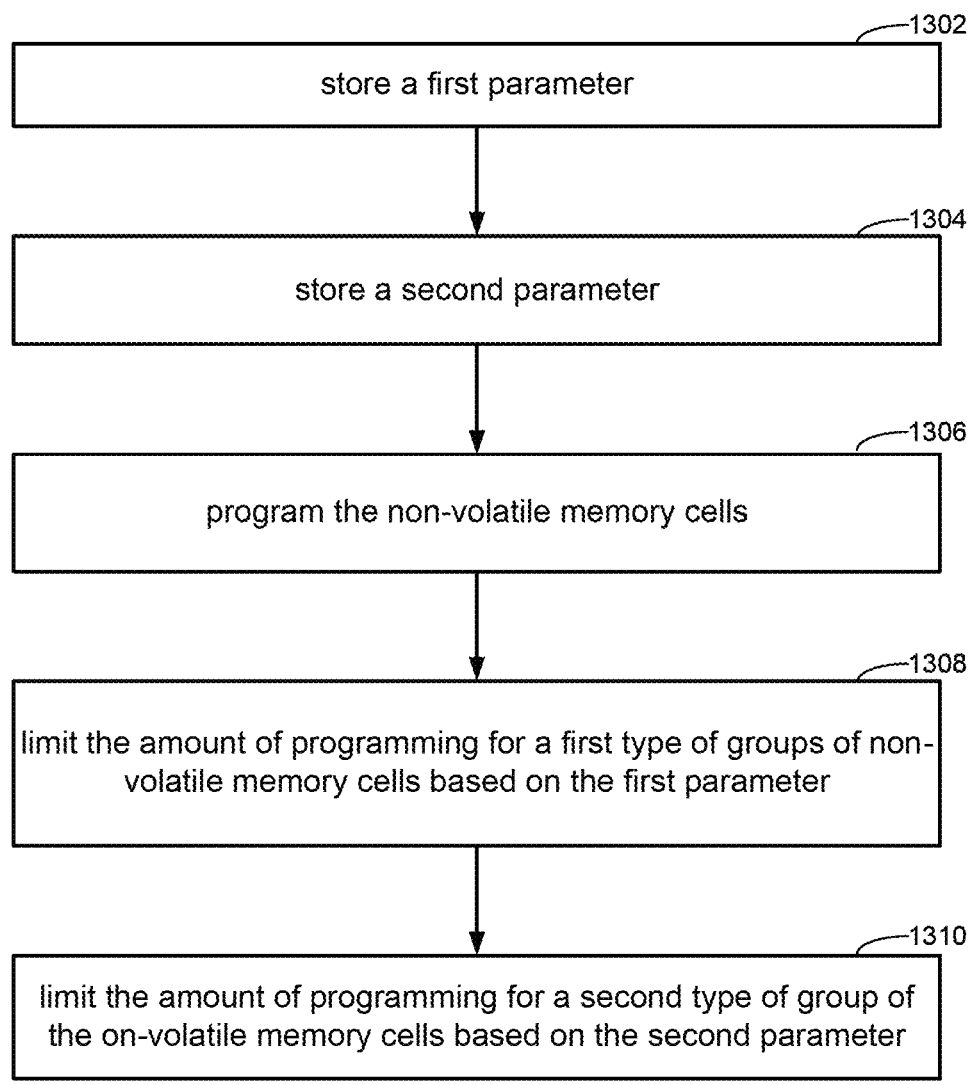
FIG. 13 is a flow chart describing one embodiment of a process for programming non-volatile memory.

FIG. 13 is a flowchart describing an embodiment of a process for programming memory cells that limits the amount of programming by limiting the number of program loops (and, thus, limiting the number of programming pulses) that can be used to program the last data state after programming to all other data states has completed based on at least two parameters. The process of FIG. 13 can be performed by any one of the one or more control circuits discussed above connected to one or more memory arrays (or other structures) as discussed above. For example, the process of FIG. 13 can be performed entirely by the memory die 200 (see FIG. 2A) or by the integrated memory assembly 207 (see FIG. 2B), rather than by memory controller 120. In one example, the process of FIG. 13 is performed by or at the direction of state machine 262, using other components of System Control Logic 260, Column Control Circuitry 210 And Row Control Circuitry 220. In another embodiment, the process of FIG. 13 is performed by or at the direction of memory controller 120. The process of FIG. 13 can be used for the embodiment of FIGS. 9/10 or the embodiment of FIGS. 11/12.

In step 1302 of FIG. 13, the one or more control circuits store a first parameter. For example, the first parameter (e.g., for standard sub-blocks or standard tiers) can be stored in memory array 202 in a section designated as ROM fuse, one or more registers, or volatile storage. In step 1304, the one or more control circuits store a second parameter. For example, the second parameter (e.g., for slow sub-blocks or slow tiers) can be stored in memory array 202 in a section designated as ROM fuse, one or more registers, or volatile storage. In step 1306, the one or more control circuits program the non-volatile memory cells. In one example, step 1306 includes programming data across multiple sub-blocks and/or across multiple tiers. The process of FIG. 7 would be used multiple times in step 1306 as the process of FIG. 7 is used to program data into all memory cells connected to a same word line in one tier of one sub-block. In step 1308, the one or more control circuits limit the amount of programming for a first type of groups of non-volatile memory cells based on the first parameter. Example of the first type of groups of non-volatile memory cells include standard sub-blocks and standard tiers. In step 1310, the one or more control circuits limit the amount of programming for a second type of group of the on-volatile memory cells based on the second parameter. Example of the second type of groups of non-volatile memory cells include slow sub-blocks and slow tiers. Other types of groupings of memory cells can also be used. In one embodiment, steps 1308 and 1310 determine which parameter to use in step 740 of FIG. 7 when step 1306 comprises performing the process of FIG. 7.

In one example implementation of FIG. 13, the one or more control circuits are configured to program the multiple groups of non-volatile memory cells to a set of data states corresponding to a plurality of threshold voltage distributions; the set of data states includes an erased data state (e.g., Er), middle data states (e.g., A-F), and a last data state (e.g., G), where the last data state corresponds to a threshold voltage distribution having highest threshold voltages of the plurality of threshold voltage distributions (see e.g., FIG. 5C); the one or more control circuits are configured to program the multiple groups of non-volatile memory cells by applying a set of voltage pulses that increase in magnitude from pulse to pulse (see steps 708 and 726 of FIG. 7); and the one or more control circuits are configured to program the multiple groups of non-volatile memory cells including limiting a number of the voltage pulses to the first group of the non-volatile memory cells based on the first parameter for programming the first group of the non-volatile memory cells to the last data state and limiting a number of the voltage pulses to the second group of the non-volatile memory cells based on the second parameter for programming the second group of the non-volatile memory cells to the last data state.

Figure 14:
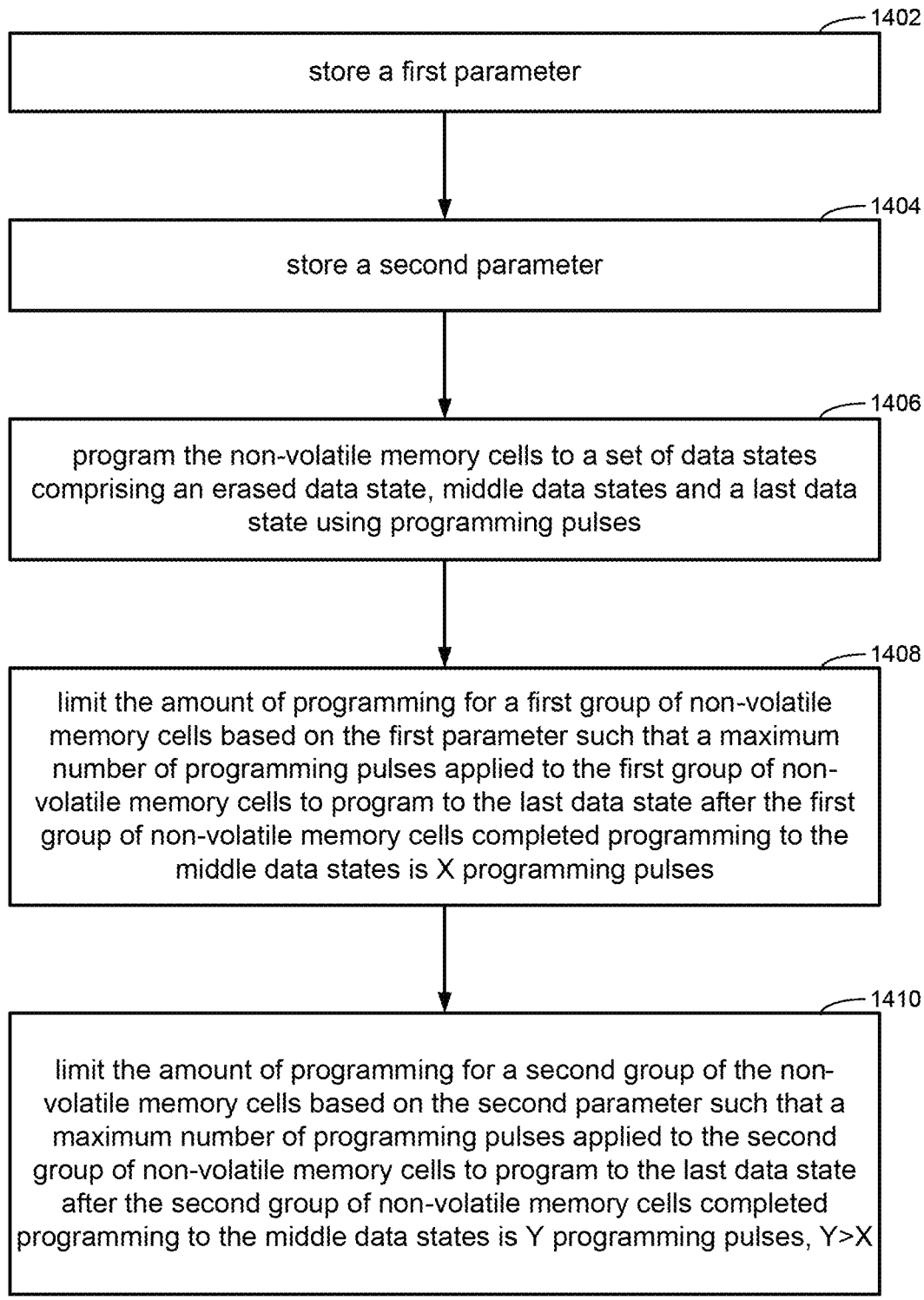
FIG. 14 is a flow chart describing one embodiment of a process for programming non-volatile memory.

FIG. 14 is a flowchart describing an embodiment of a process for programming memory cells that limits the amount of programming by limiting the number of program loops (and, thus, limiting the number of programming pulses) that can be used to program the last data state after programming to all other data states has completed based on at least two parameters. The process of FIG. 14 can be performed by any one of the one or more control circuits discussed above connected to one or more memory arrays (or other structures) as discussed above. For example, the process of FIG. 14 can be performed entirely by the memory die 200 (see FIG. 2A) or by the integrated memory assembly 207 (see FIG. 2B), rather than by memory controller 120. In one example, the process of FIG. 14 is performed by or at the direction of state machine 262, using other components of System Control Logic 260, Column Control Circuitry 210 And Row Control Circuitry 220. In another embodiment, the process of FIG. 14 is performed by or at the direction of memory controller 120. The process of FIG. 14 can be used for the embodiment of FIGS. 9/10 or the embodiment of FIGS. 11/12. In one set of embodiments, the process of FIG. 14 is an example implementation of the process of FIG. 13.

In step 1402 of FIG. 14, the one or more control circuits store a first parameter. For example, the first parameter (e.g., for standard sub-blocks or standard tiers) can be stored in memory array 202 in a section designated as ROM fuse, one or more registers, or volatile storage. In step 1404, the one or more control circuits store a second parameter. For example, the second parameter (e.g., for slow sub-blocks or slow tiers) can be stored in memory array 202 in a section designated as ROM fuse, one or more registers, or volatile storage.

In step 1406, the one or more control circuits program the non-volatile memory cells to a set of data states comprising an erased data state (e.g., Er—see FIG. 5C), middle data states (e.g., data states A-F) and a last data state (e.g., data state G) using programming pulses (see steps 708 and 726 of FIG. 7). In one example, step 1406 includes programming data across multiple sub-blocks and/or across multiple tiers. The process of FIG. 7 would be used multiple times in step 1406 as the process of FIG. 7 is used to program data into all memory cells connected to a same word line in one tier of one sub-block.

In step 1408, the one or more control circuits limit the amount of programming for a first group of non-volatile memory cells based on the first parameter such that a maximum number of programming pulses applied to the first group of non-volatile memory cells to program to the last data state after the first group of non-volatile memory cells completed programming to the middle data states is X programming pulses. In step 1410, the one or more control circuits limit the amount of programming for a second group of the on-volatile memory cells based on the second parameter such that a maximum number of programming pulses applied to the second group of non-volatile memory cells to program to the last data state after the second group of non-volatile memory cells completed programming to the middle data states is Y programming pulses. Y and be set independently and differently than X. In one embodiment, Y>X (see e.g., FIGS. 10 and 12). In one embodiment, steps 1408 and 1410 determine which parameter to use in step 740 of FIG. 7 when step 1406 comprises performing the process of FIG. 7.

Figure 15:
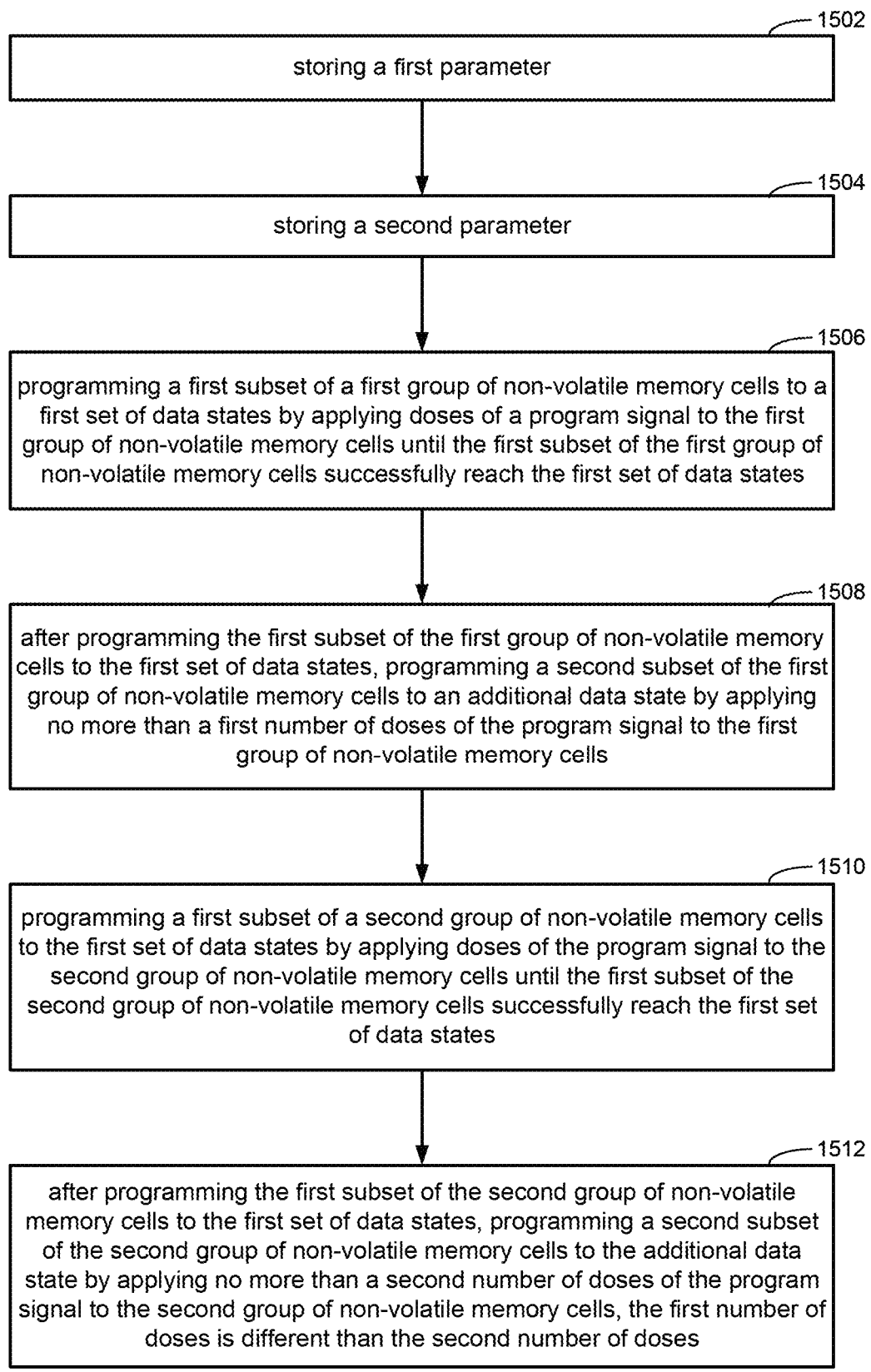
FIG. 15 is a flow chart describing one embodiment of a process for programming non-volatile memory.

FIG. 15 is a flowchart describing an embodiment of a process for programming memory cells that limits the amount of programming by limiting the number of program loops (and, thus, limiting the number of programming pulses) that can be used to program the last data state after programming to all other data states has completed based on at least two parameters. The process of FIG. 15 can be performed by any one of the one or more control circuits discussed above connected to one or more memory arrays (or other structures) as discussed above. For example, the process of FIG. 15 can be performed entirely by the memory die 200 (see FIG. 2A) or by the integrated memory assembly 207 (see FIG. 2B), rather than by memory controller 120. In one example, the process of FIG. 15 is performed by or at the direction of state machine 262, using other components of System Control Logic 260, Column Control Circuitry 210 And Row Control Circuitry 220. In another embodiment, the process of FIG. 15 is performed by or at the direction of memory controller 120. The process of FIG. 15 can be used for the embodiment of FIGS. 9/10 or the embodiment of FIGS. 11/12. In one set of embodiments, the process of FIG. 15 is an example implementation of the process of FIG. 13. In one set of embodiments, the process of FIG. 15 is an example implementation of the process of FIG. 14.

In step 1502 of FIG. 15, the one or more control circuits store a first parameter. For example, the first parameter (e.g., for standard sub-blocks or standard tiers) can be stored in memory array 202 in a section designated as ROM fuse, one or more registers, or volatile storage. In step 1504, the one or more control circuits store a second parameter. For example, the second parameter (e.g., for slow sub-blocks or slow tiers) can be stored in memory array 202 in a section designated as ROM fuse, one or more registers, or volatile storage.

In step 1506, the one or more control circuits program a first subset of a first group of non-volatile memory cells (e.g., standard) to a first set of data states (e.g., data states A-F) by applying doses of a program signal (e.g., programming pulses of FIG. 7) to the first group of non-volatile memory cells (e.g., standard sub-blocks or tiers) until the first subset of the first group of non-volatile memory cells successfully reach the first set of data states. In step 1508, after programming the first subset of the first group of non-volatile memory cells to the first set of data states, the one or more control circuits program a second subset of the first group of non-volatile memory cells to an additional data state (e.g., data state G) by applying no more than a first number of doses of the program signal to the first group of non-volatile memory cells. In one embodiment, steps 1506 and 1508 are implemented by performing the process of FIG. 7 using the first parameter for standard sub-blocks or standard tiers.

In step 1510, the one or more control circuits program a first subset of a second group of non-volatile memory cells (e.g., slow) to the first set of data states by applying doses of the program signal (e.g., programming pulses of FIG. 7) to the second group of non-volatile memory cells until the first subset of the second group of non-volatile memory cells successfully reach the first set of data states. In step 1512, after programming the first subset of the second group of non-volatile memory cells to the first set of data states, the one or more control circuits program a second subset of the second group of non-volatile memory cells to the additional data state (e.g., data state G) by applying no more than a second number of doses of the program signal to the second group of non-volatile memory cells. In one embodiment, the first number of doses is different than the second number of doses. In one embodiment, steps 1510 and 1510 are implemented by performing the process of FIG. 7 using the second parameter for slow sub-blocks or slow tiers.

A memory system using different parameters for different groups of non-volatile memory cells has been disclosed in order to achieve faster programming speeds.

One embodiment includes a non-volatile storage apparatus, comprising: a non-volatile memory structure comprising multiple groups of non-volatile memory cells, the non-volatile memory structure configured to store a first parameter and a second parameter; and one or more control circuits connected to the non-volatile memory structure. The one or more control circuits are configured to program the multiple groups of non-volatile memory cells including limiting the amount of programming for a first group of the non-volatile memory cells based on the first parameter and limiting the amount of programming for a second group of the non-volatile memory cells based on the second parameter.

In one example implementation, the non-volatile memory structure further comprises word lines and blocks, each of the blocks are divided into sub-blocks; all of the non-volatile memory cells of the first group of non-volatile memory cells are connected to a first word line and are in a first sub-block; and all of the non-volatile memory cells of the second group of non-volatile memory cells are connected to a second word line and are in a second sub-block.

In one example implementation, the non-volatile memory structure further comprises word lines and blocks, each of the blocks are divided into sub-blocks including inner sub-blocks and outer sub-blocks; the first group of non-volatile memory cells and the second group of non-volatile memory cells are part of a first block that comprises a first outer sub-block, a second outer sub-block and a first inner sub-block between the first outer sub-block and the second outer sub-block; all of the non-volatile memory cells of the first group of non-volatile memory cells are in the first inner sub-block; all of the non-volatile memory cells of the second group of non-volatile memory cells are in the first outer sub-block; and the first parameter limits the amount of programming for the first group of the non-volatile memory cells more than the second parameter limits the amount of programming for the second group of the non-volatile memory cells.

In one example implementation, the non-volatile memory structure further comprises word lines and blocks, each of the blocks are divided into sub-blocks including inner sub-blocks and outer sub-blocks; the first group of non-volatile memory cells and the second group of non-volatile memory cells are part of a first block that comprises a first outer sub-block, a second outer sub-block and a first inner sub-block between the first outer sub-block and the second outer sub-block; all of the sub-blocks comprise tiers including an upper tier and a lower tier; all of the non-volatile memory cells of the first group of non-volatile memory cells are in one or more tiers of sub-blocks of the first block other than the upper tier of the first outer sub-block and the upper tier of the second outer sub-block; all of the non-volatile memory cells of the second group of non-volatile memory cells are in the upper tier of the first outer sub-block; and the first parameter limits the amount of programming for the first group of the non-volatile memory cells more than the second parameter limits the amount of programming for the second group of the non-volatile memory cells.

In one example implementation, the one or more control circuits are configured to program the multiple groups of non-volatile memory cells to a set of data states corresponding to a plurality of threshold voltage distributions; the set of data states includes a last data state that corresponds to a threshold voltage distribution having highest threshold voltages of the plurality of threshold voltage distributions; and the one or more control circuits are configured to program the multiple groups of non-volatile memory cells including limiting the amount of programming to the last data state for the first group of the non-volatile memory cells based on the first parameter and limiting the amount of programming to the last data state for the second group of the non-volatile memory cells based on the second parameter.

In one example implementation, the one or more control circuits are configured to program the multiple groups of non-volatile memory cells to a set of data states corresponding to a plurality of threshold voltage distributions; the set of data states includes a last data state that corresponds to a threshold voltage distribution having highest threshold voltages of the plurality of threshold voltage distributions; the one or more control circuits are configured to program the multiple groups of non-volatile memory cells by applying a set of voltage pulses; the one or more control circuits are configured to program the multiple groups of non-volatile memory cells including limiting a number of the voltage pulses to the first group of the non-volatile memory cells based on the first parameter for programming the first group of the non-volatile memory cells to the last data state and limiting a number of the voltage pulses to the second group of the non-volatile memory cells based on the second parameter for programming the second group of the non-volatile memory cells to the last data state.

In one example implementation, the first parameter is capable of storing multiple values including a value indicating to disable the limiting of the amount of programming for the first group of the non-volatile memory cells; and the second parameter is capable of storing multiple values including a value indicating to disable the limiting of the amount of programming for the second group of the non-volatile memory cells.

One embodiment includes a method of operating non-volatile storage, comprising: programming a first subset of a first group of non-volatile memory cells to a first set of data states by applying doses of a program signal to the first group of non-volatile memory cells until the first subset of the first group of non-volatile memory cells successfully reach the first set of data states; after programming the first subset of the first group of non-volatile memory cells to the first set of data states, programming a second subset of the first group of non-volatile memory cells to an additional data state by applying no more than a first number of doses of the program signal to the first group of non-volatile memory cells; programming a first subset of a second group of non-volatile memory cells to the first set of data states by applying doses of the program signal to the second group of non-volatile memory cells until the first subset of the second group of non-volatile memory cells successfully reach the first set of data states; and after programming the first subset of the second group of non-volatile memory cells to the first set of data states, programming a second subset of the second group of non-volatile memory cells to the additional data state by applying no more than a second number of doses of the program signal to the second group of non-volatile memory cells, the first number of doses is different than the second number of doses.

One embodiment includes a non-volatile storage apparatus, comprising: a first group of non-volatile memory cells and a second group of non-volatile memory cells; and means for programming the first group of non-volatile memory cells and the second group of non-volatile memory cells to a set of data states comprising an erased data state, middle data states and a last data state using programming pulses such that a maximum number of programming pulses applied to the first group of non-volatile memory cells to program to the last data state after the first group of non-volatile memory cells completed programming to the middle data states is X programming pulses and a maximum number of programming pulses applied to the second group of non-volatile memory cells to program to the last data state after the second group of non-volatile memory cells completed programming to the middle data states is Y programming pulses, X is different than Y.

Examples of the above-mentioned means for programming can comprise includes any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits (including hardware only or a combination of hardware and software/firmware) performing the processes of FIGS. 13-15.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
   a non-volatile memory structure comprising multiple word lines and multiple groups of non-volatile memory cells configured to store data in a set of data states comprising an erased data state and middle data states and a last data state, the multiple groups of non-volatile memory cells comprise a first group of the non-volatile memory cells and a second group of the non-volatile memory cells in a same block of non-volatile memory cells, the block of non-volatile memory cells is divided into a first outer sub-block and a second outer sub-block and a first inner sub-block between the first outer sub-block and the second outer sub-block, all of the non-volatile memory cells of the first group of non-volatile memory cells are in the first inner sub-block, all of the non-volatile memory cells of the second group of non-volatile memory cells are in the first outer sub-block, each of the multiple word lines is connected to the first outer sub-block and the second outer sub-block and the first inner sub-block; and
   one or more control circuits connected to the non-volatile memory structure, the one or more control circuits are configured to:
      store a value for X, X is a first parameter;
      store a value for Y, Y is a second parameter, X is different than Y; and
      program the first group of non-volatile memory cells separately from programming the second group of non-volatile memory cells using programming pulses such that a maximum number of programming pulses applied to the first group of non-volatile memory cells to program to the last data state after the first group of non-volatile memory cells completed programming to the middle data states is X programming pulses and a maximum number of programming pulses applied to the second group of non-volatile memory cells to program to the last data state after the second group of non-volatile memory cells completed programming to the middle data states is Y programming pulses.

2. The non-volatile storage apparatus of claim 1, wherein the one or more control circuits are configured to program the first group of non-volatile memory cells separately from programming the second group of non-volatile memory cells by:
   programming a first subset of the first group of non-volatile memory cells to the middle data states by applying programming pulses of a program signal to the first group of non-volatile memory cells until the first subset of the first group of non-volatile memory cells successfully reach the middle data states;
   after programming the first subset of the first group of non-volatile memory cells to the middle data states, programming a second subset of the first group of non-volatile memory cells to the last data state by applying no more than the X number of programming pulses of the program signal to the first group of non-volatile memory cells;
   programming a first subset of the second group of non-volatile memory cells to the middle data states by applying programming pulses of the program signal to the second group of non-volatile memory cells until the first subset of the second group of non-volatile memory cells successfully reach the middle data states; and after programming the first subset of the second group of non-volatile memory cells to the middle data states, programming a second subset of the second group of non-volatile memory cells to the last data state by applying no more than the Y number of programming pulses of the program signal to the second group of non-volatile memory cells.

3. The non-volatile storage apparatus of claim 2, wherein: the programming pulses of the program signal are voltage pulses that increase in magnitude from pulse to pulse.

4. The non-volatile storage apparatus of claim 1, wherein: the set of data states correspond to a plurality of threshold voltage distributions; and the set of data states includes the last data state that corresponds to a threshold voltage distribution having highest threshold voltages of the plurality of threshold voltage distributions.

5. The non-volatile storage apparatus of claim 1, wherein: all of the non-volatile memory cells of the first group of non-volatile memory cells are part of vertical NAND strings and are connected to a first word line;

all of the non-volatile memory cells of the second group of non-volatile memory cells are part of vertical NAND strings and are connected to a second word line;

the non-volatile memory structure is positioned on a memory die; and the one or more control circuits are positioned on a control die that is directly bonded to the memory die.

6. A non-volatile storage apparatus, comprising:

a non-volatile memory structure comprising multiple groups of non-volatile memory cells, the non-volatile memory structure is configured to store a first parameter and a second parameter; and one or more control circuits connected to the non-volatile memory structure, the one or more control circuits are configured to program the multiple groups of non-volatile memory cells including limiting the amount of programming for a first group of the non-volatile memory cells based on the first parameter and limiting the amount of programming for a second group of the non-volatile memory cells based on the second parameter, the first parameter is capable of storing multiple values including a value indicating to disable the limiting of the amount of programming for the first group of the non-volatile memory cells and the second parameter is capable of storing multiple values including a value indicating to disable the limiting of the amount of programming for the second group of the non-volatile memory cells.

7. A method of operating non-volatile storage, comprising:

programming a first subset of a first group of non-volatile memory cells to a first set of data states by applying doses of a program signal to the first group of non-volatile memory cells until the first subset of the first group of non-volatile memory cells successfully reach the first set of data states;

after programming the first subset of the first group of non-volatile memory cells to the first set of data states, programming a second subset of the first group of non-volatile memory cells to an additional data state by applying no more than a first number of doses of the program signal to the first group of non-volatile memory cells;

programming a first subset of a second group of non-volatile memory cells to the first set of data states by applying doses of the program signal to the second group of non-volatile memory cells until the first subset of the second group of non-volatile memory cells successfully reach the first set of data states; and after programming the first subset of the second group of non-volatile memory cells to the first set of data states, programming a second subset of the second group of non-volatile memory cells to the additional data state by applying no more than a second number of doses of the program signal to the second group of non-volatile memory cells, the first number of doses is different than the second number of doses;

wherein the first group of non-volatile memory cells and the second group of non-volatile memory cells are part of a block of non-volatile memory cells that comprises sub-blocks including a first outer sub-block, a second outer sub-block and inner sub-blocks between the first outer sub-block and the second outer sub-block, all of the sub-blocks comprise tiers including an upper tier and a lower tier, all of the non-volatile memory cells of the first group of non-volatile memory cells are in one or more tiers of the sub-blocks other than the upper tier of the first outer sub-block and the upper tier of the second outer sub-block, all of the non-volatile memory cells of the second group of non-volatile memory cells are in the upper tier of the first outer sub-block and the first number of doses is less than the second number of doses.

8. The method of claim 7, further comprising;

storing a first parameter that indicates the first number of doses, the programming the second subset of the second group of non-volatile memory cells to the additional data state is limited to no more than the first number of doses of the program signal based on the first parameter; and storing a second parameter that indicates the second number of doses, the programming the second subset of the second group of non-volatile memory cells to the additional data state is limited to no more than the second number of doses of the program signal based on the second parameter.

9. The method of claim 7, wherein:

all of the non-volatile memory cells of the first group of non-volatile memory cells are connected to a first word line; and all of the non-volatile memory cells of the second group of non-volatile memory cells are connected to a second word line.

* * * * *